(12) United States Patent
Sawamizu et al.

(10) Patent No.: US 7,554,119 B2
(45) Date of Patent: Jun. 30, 2009

(54) ACTIVE MATRIX SUBSTRATE AND ITS MANUFACTURING METHOD

(75) Inventors: Kyoko Sawamizu, Kumamoto (JP); Makoto Ohtani, Kumamoto (JP); Yasushi Matsui, Kumamoto (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 52 days.

(21) Appl. No.: 11/274,281

(22) Filed: Nov. 16, 2005

(65) Prior Publication Data

US 2006/0169983 A1 Aug. 3, 2006

(30) Foreign Application Priority Data

Jan. 31, 2005 (JP) .............................. 2005-022540

(51) Int. Cl.
H01L 27/14 (2006.01)
H01L 29/04 (2006.01)
H01L 29/15 (2006.01)
H01L 31/036 (2006.01)

(52) U.S. Cl. ......................................... 257/72; 257/59
(58) Field of Classification Search .................. 257/59, 257/72
See application file for complete search history.

(56) References Cited

U.S. PATENT DOCUMENTS

| | | | | |
|---|---|---|---|---|
| 5,066,106 A | * | 11/1991 | Sakamoto et al. | 349/54 |
| 5,270,845 A | * | 12/1993 | Sakamoto et al. | 349/147 |
| 5,917,571 A | | 6/1999 | Shimada | |
| 6,614,496 B1 | * | 9/2003 | Song et al. | 349/114 |
| 6,654,076 B2 | * | 11/2003 | Ha et al. | 349/43 |
| 6,667,777 B2 | | 12/2003 | Kikkawa et al. | |
| 6,794,228 B2 | | 9/2004 | Kim | |
| 6,812,912 B2 | | 11/2004 | Miyajima et al. | |
| 6,853,421 B2 | | 2/2005 | Ihida et al. | |
| 6,927,820 B2 | | 8/2005 | Jang et al. | |
| 6,933,988 B2 | * | 8/2005 | Ohgami et al. | 349/39 |
| 2003/0160921 A1 | * | 8/2003 | Nakashima et al. | 349/113 |
| 2004/0125325 A1 | * | 7/2004 | Murai et al. | 349/187 |
| 2005/0219451 A1 | | 10/2005 | Masutani et al. | |
| 2006/0086937 A1 | | 4/2006 | Fujii et al. | |

FOREIGN PATENT DOCUMENTS

| | | |
|---|---|---|
| JP | 09-015644 | 1/1997 |
| JP | 9-15644 A | 1/1997 |

(Continued)

Primary Examiner—Jerome Jackson, Jr.
Assistant Examiner—Anthony Ho
(74) Attorney, Agent, or Firm—Buchanan Ingersoll & Rooney PC

(57) ABSTRACT

An active matrix substrate with a high aperture ratio is provided, which is capable of preventing electrical short circuits between pixel electrodes and auxiliary capacitive electrodes. Gate lines and auxiliary capacitive electrodes are formed on an insulated substrate. The auxiliary capacitive electrodes have holes formed therethrough. To cover the gate lines and the auxiliary capacitive electrodes, a first interlayer insulating film is formed, on which source lines, a semiconductor layer, and drain electrodes are formed. Then, a second interlayer insulating film is formed to cover all those layers. In the second interlayer insulating film, contact holes are formed to reach the drain electrodes in areas corresponding to the areas of the holes. Pixel electrodes formed on the second interlayer insulating film are connected to the drain electrodes through the contact

8 Claims, 19 Drawing Sheets

FOREIGN PATENT DOCUMENTS

| | | |
|---|---|---|
| JP | 9-325330 A | 12/1997 |
| JP | 10-268340 | 10/1998 |
| JP | 2000-187248 | 7/2000 |
| JP | 2000-221488 A | 8/2000 |
| JP | 2001-092377 | 4/2001 |
| JP | 2002-55360 A | 2/2002 |
| JP | 2002-055361 | 2/2002 |
| JP | 2002-094072 | 3/2002 |
| JP | 2002-297060 | 10/2002 |
| JP | 2003-050389 | 2/2003 |
| JP | 2003-222890 | 8/2003 |
| JP | 2004-038186 | 2/2004 |
| JP | 2004-046223 | 2/2004 |
| JP | 2004-070355 | 3/2004 |
| JP | 2004-212952 | 7/2004 |
| JP | 2004-247704 | 9/2004 |
| JP | 2005-121908 | 5/2005 |
| JP | 2005-292660 | 10/2005 |

* cited by examiner

F I G . 1
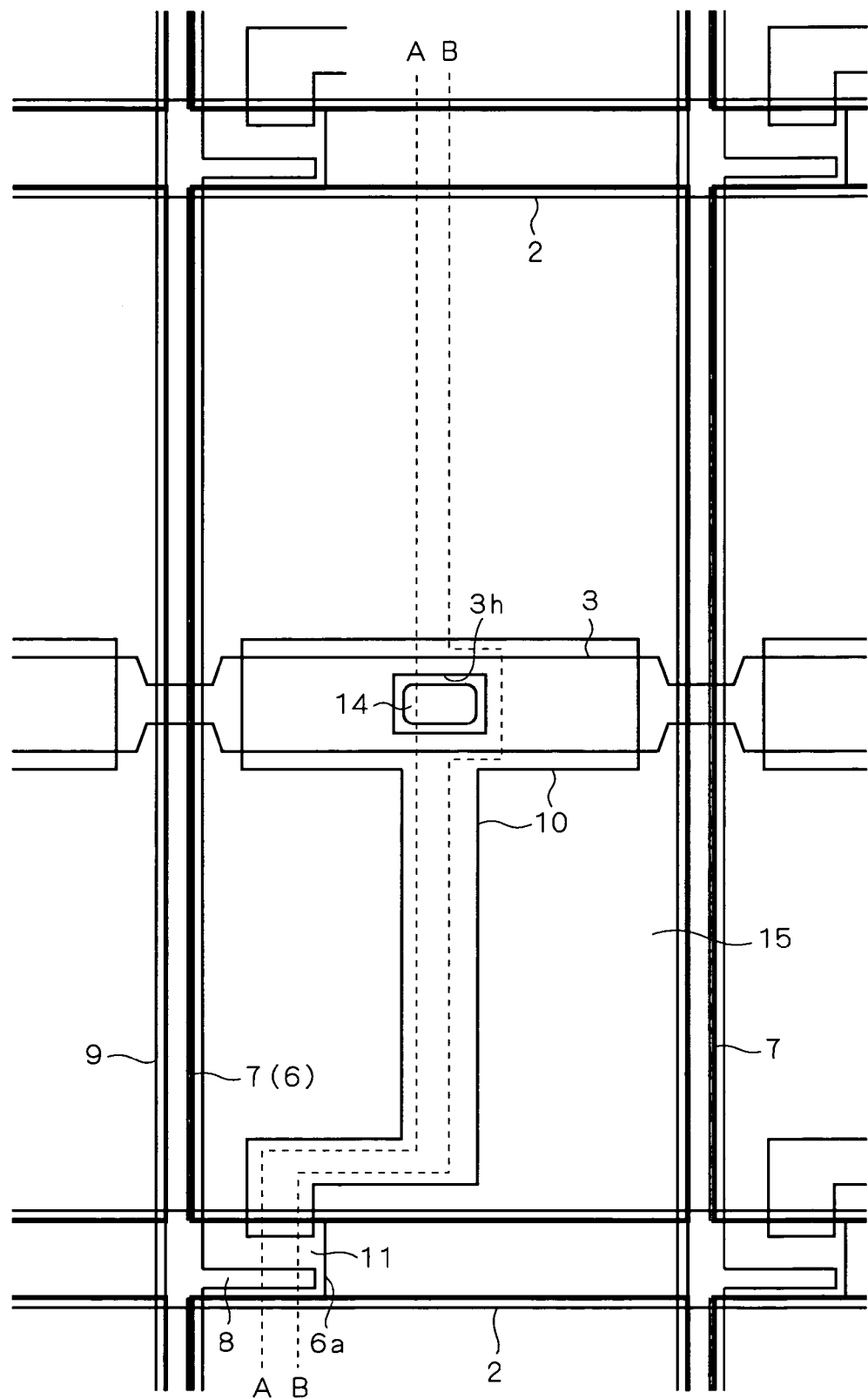

FIG. 4
2
1
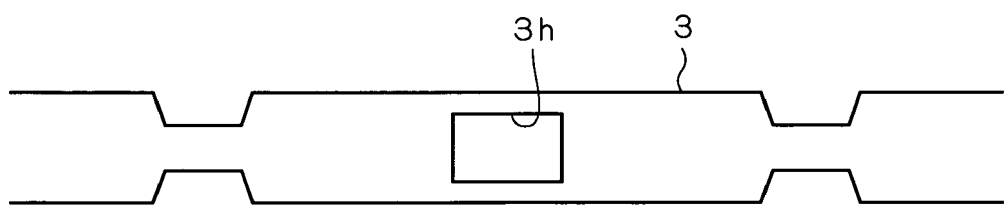
3h   3
2

F I G . 8
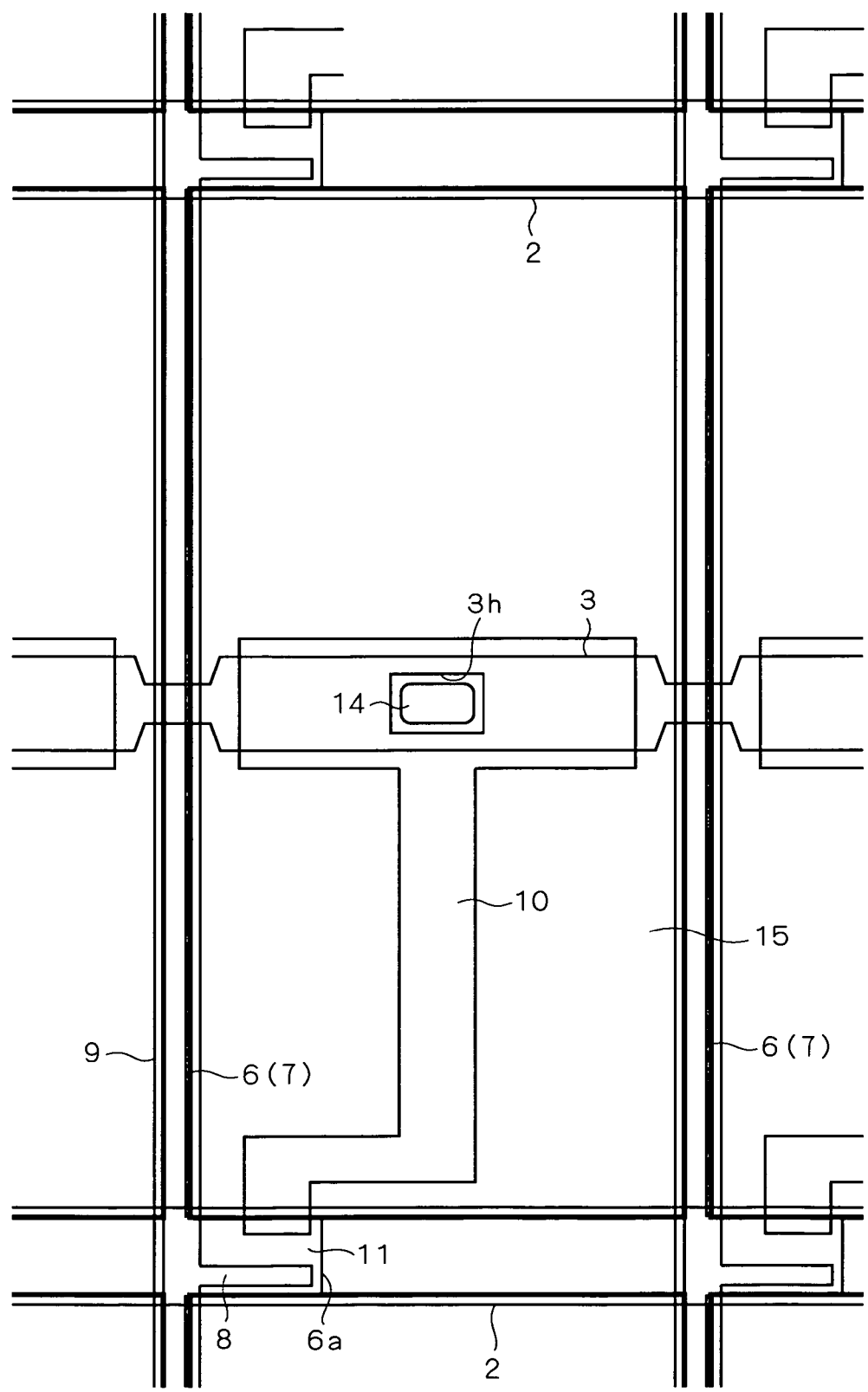

FIG. 15
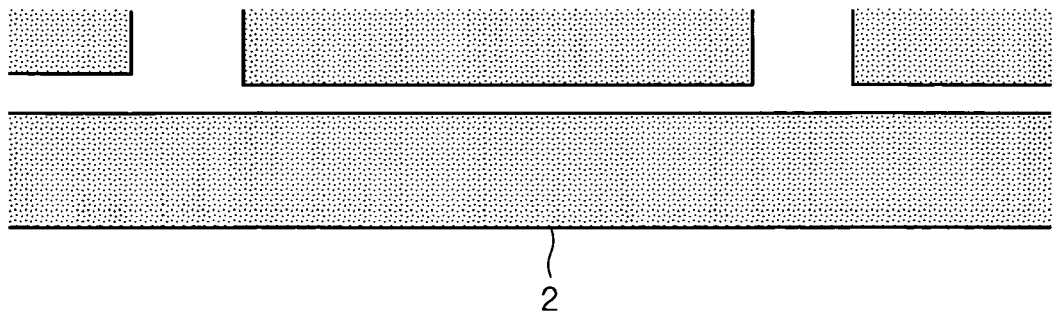
1
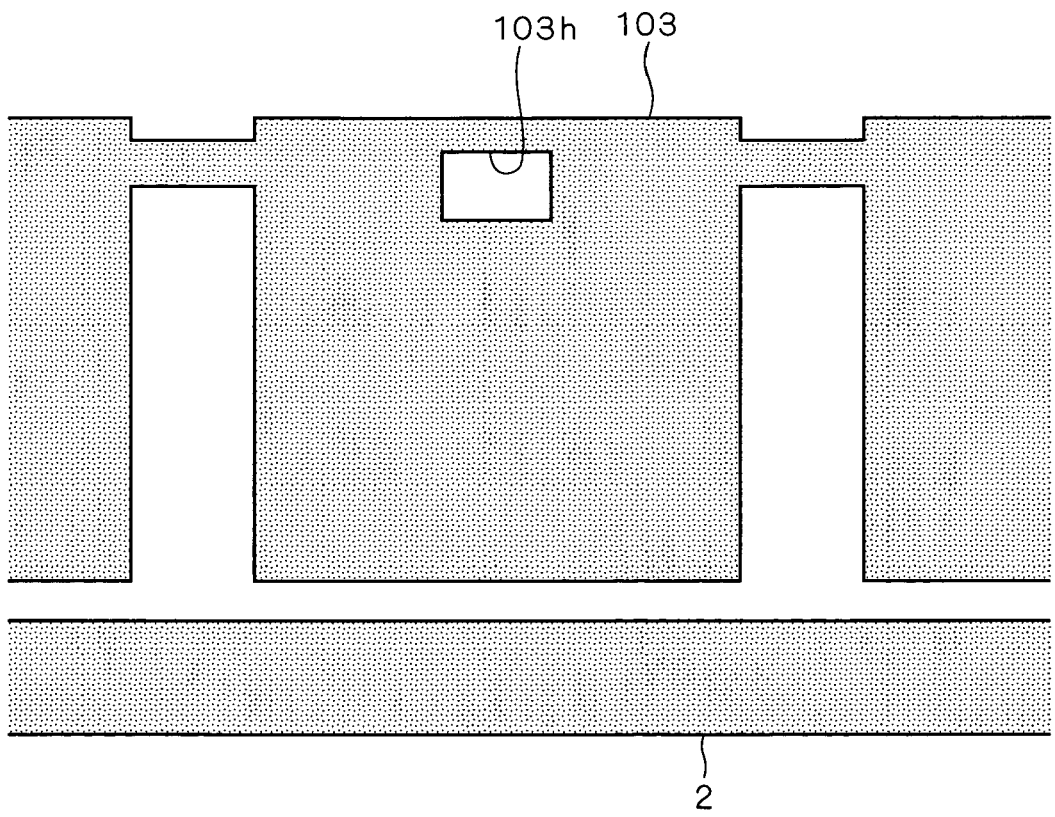

F I G . 1 6
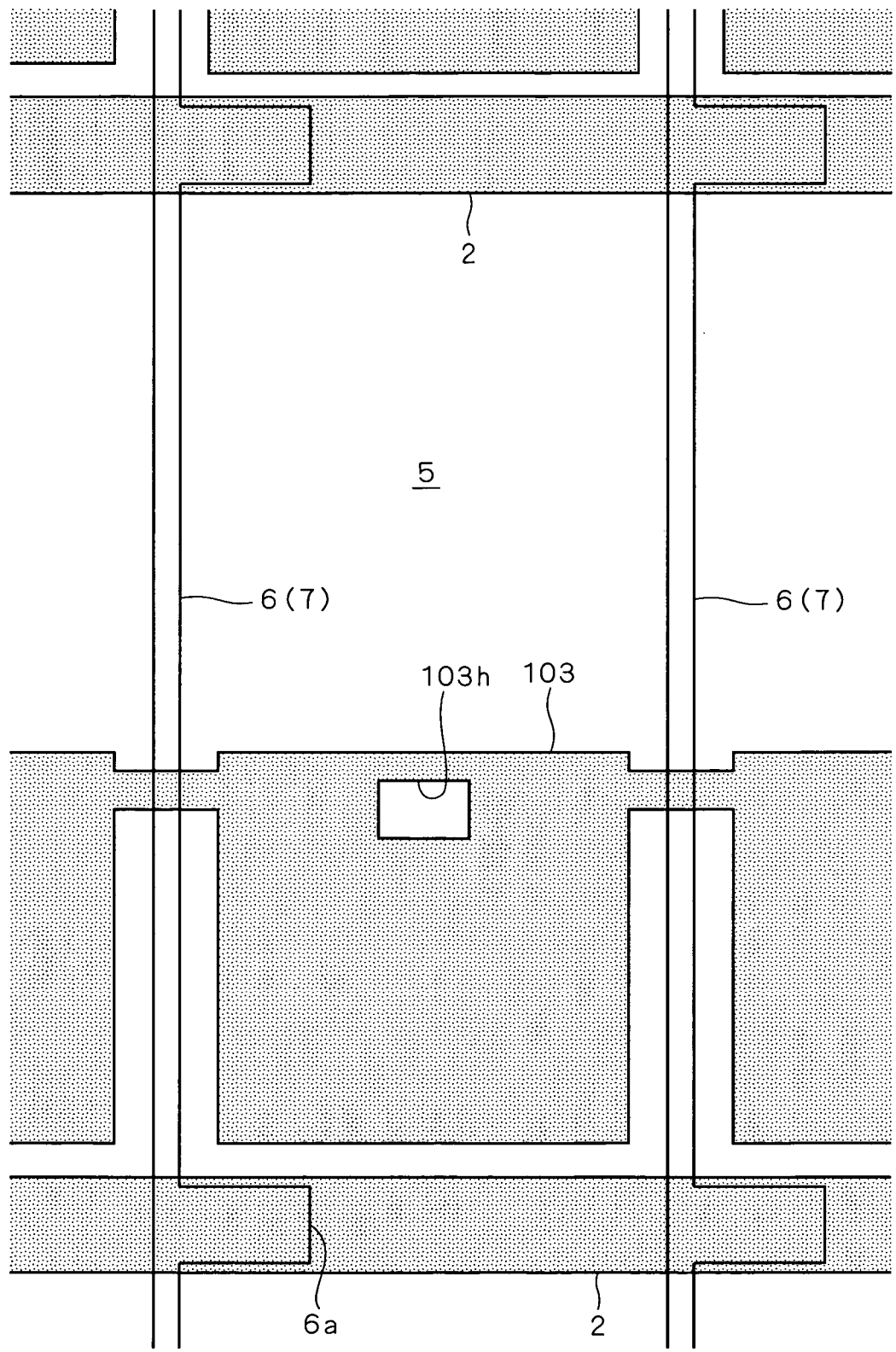

ACTIVE MATRIX SUBSTRATE AND ITS MANUFACTURING METHOD

BACKGROUND OF THE INVENTION

1. Field of the Invention

The present invention relates to an active matrix substrate for use in displays such as liquid crystal displays and organic electroluminescent displays.

2. Description of the Background Art

Well known electro-optical displays, such as liquid crystal displays and organic electroluminescent displays, are active matrix types which have a plurality of switching elements such as thin-film transistors (TFTs) arranged on an insulated substrate and apply voltage independently to each pixel.

Especially in displays using liquid crystals as electro-optical elements, it is important to achieve active matrix substrates with a large display area of each pixel, i.e., with high aperture ratios, for bright and high-quality display.

One example of such active matrix substrates with high aperture ratios has been suggested in Japanese Patent Application Laid-open No. 9-325330 (1997) (FIGS. 1 and 2). This patent document has disclosed a structure in which an organic interlayer insulating film is formed to cover both gate and source signal lines, and pixel electrodes are formed on the organic interlayer insulating film. This active matrix substrate allows the pixel electrodes to overlap the signal lines, thereby increasing the aperture ratios of liquid crystal displays as well as shielding electric fields caused by the signal lines and thus inhibiting imperfect orientation of liquid crystals.

However, the organic interlayer insulating film in the above active matrix substrate is water absorbent and porous and thus may have an increased moisture density. If, in this condition, voltage is applied to TFTs, electrical charges will be induced on the surface of a channel region of a semiconductor layer under the influence of polarization of the interlayer insulating film resulting from moisture. This deteriorates off-current characteristics of the TFTs and thereby causes display defects such as display unevenness.

One example of methods to solve this problem has been suggested in Japanese Patent Application Laid-open No. 2000-221488 (FIGS. 1, 4, and 5).

An active matrix substrate disclosed in this patent document is such that an inorganic passivation film of, for example, silicon nitride is formed under an organic interlayer insulating film to protect a channel region of a semiconductor layer. Besides, the organic interlayer insulating film is made of an organic material containing water absorbing or moisture adsorbent particles. This prevents deterioration in the off-current characteristics of TFTs caused by polarization resulting from moisture.

However, in the structure disclosed in this patent document, etching of the inorganic passivation film may result in excessive etching to an insulation film located under the passivation film, thereby causing short circuits between pixel electrodes and auxiliary capacitive electrodes.

Thus, in the active matrix substrate disclosed in Japanese Patent Application Laid-open No. 2000-221488, it is necessary to form contact holes by, for example, dry etching the inorganic passivation film, in order to establish connection between the drain electrodes and the pixel electrodes. At this time, if there are pin holes in a metal film used to form source and drain electrodes, especially in areas of the metal film where contact holes are formed, a gate insulating film under the metal film may be etched through the pin holes simultaneously as the process of removing the passivation film by dry etching. This causes the contact holes to reach the underlying auxiliary capacitive electrodes through the gate insulating film and thereby causes short circuits between the pixel electrodes and the auxiliary capacitive electrodes, resulting in the occurrence of display defects.

SUMMARY OF THE INVENTION

It is an object of the present invention to provide an active matrix substrate with a high aperture ratio, which is capable of preventing electrical short circuits between pixel electrodes and auxiliary capacitive electrodes.

According to an aspect of the present invention, the active matrix substrate includes a substrate; gate lines and auxiliary capacitive electrodes; a first interlayer insulating film; source lines; semiconductor layers; drain electrodes; a second interlayer insulating film; and pixel electrodes. The gate lines and the auxiliary capacitive electrodes are formed on the substrate. The first interlayer insulating film covers the gate lines and the auxiliary capacitive electrodes. The source lines are formed on the first interlayer insulating film to intersect with the gate lines. The semiconductor layers constitute switching elements at intersections of the gate lines and the source lines. The drain electrodes each correspond to each one of the switching elements. The second interlayer insulating film covers the source lines, the semiconductor layers, and the drain electrodes. The pixel electrodes are connected to the drain electrodes through contact holes formed in the second interlayer insulating film. The drain electrodes are opposed in part to the auxiliary capacitive electrodes with the first interlayer insulating film sandwiched in between, so as to form holding capacitances for the pixel electrodes. The contact holes are formed to reach the drain electrodes in areas surrounded by areas where the auxiliary capacitive electrodes are formed, but not in the areas where the auxiliary capacitive electrodes are formed.

This active matrix substrate prevents a situation such as extension of the contact holes to the auxiliary capacitive electrodes and thereby prevents electrical short circuits between the pixel electrodes and the auxiliary capacitive electrodes. Further, forming the pixel electrodes to overlap the respective lines achieves a high aperture ratio.

According to another aspect of the present invention, the method of manufacturing a matrix substrate includes the following steps (a) to (h). The step (a) is to form gate lines and auxiliary capacitive electrodes on a substrate. The step (b) is to form a first interlayer insulating film to cover the gate lines and the auxiliary capacitive electrodes. The step (c) is to form semiconductor layers constituting switching elements. The step (d) is to form source lines on the first interlayer insulating film to intersect with the gate lines. The step (e) is to form drain electrodes so that at least parts of the drain electrodes are opposed to the auxiliary capacitive electrodes with the first interlayer insulating film sandwiched in between. The step (f) is to form a second interlayer insulating film to cover the semiconductor layers, the source lines, and the drain electrodes. The step (g) is to form contact holes in the second interlayer insulating film to reach the drain electrodes in areas surrounded by areas where the auxiliary capacitive electrodes are formed, but not in the areas where the auxiliary capacitive electrodes are formed. The step (h) is to form pixel electrodes on the second interlayer insulating film to be connected to the drain electrodes through the contact holes.

The active matrix substrate manufactured prevents a situation such as extension of the contact holes to the auxiliary capacitive electrodes and thereby prevents electrical short circuits between the pixel electrodes and the auxiliary capacitive electrodes. Further, forming the pixel electrodes to overlap the respective lines achieves a high aperture ratio.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view of an active matrix substrate according to a first preferred embodiment;

FIGS. 4 to 8 are plan views showing the steps in the method of manufacturing an active matrix substrate;

FIGS. 15 to 20 are plan views showing the steps in the method of manufacturing an active matrix substrate.

DESCRIPTION OF THE PREFERRED EMBODIMENTS

First Preferred Embodiment

Now, an active matrix substrate according to a first preferred embodiment of the present invention will be described. This preferred embodiment describes an active matrix substrate for use in transmissive liquid crystal displays.

Figure 2:
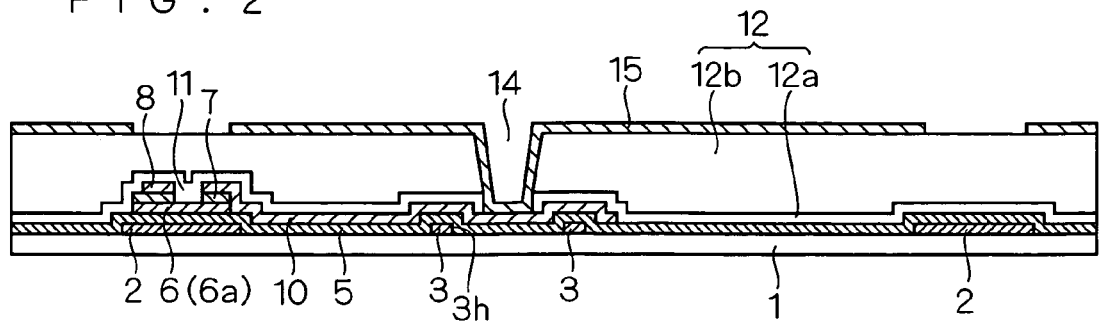
FIG. 2 is a cross-sectional view taken along line A-A of FIG. 1.
Figure 3:
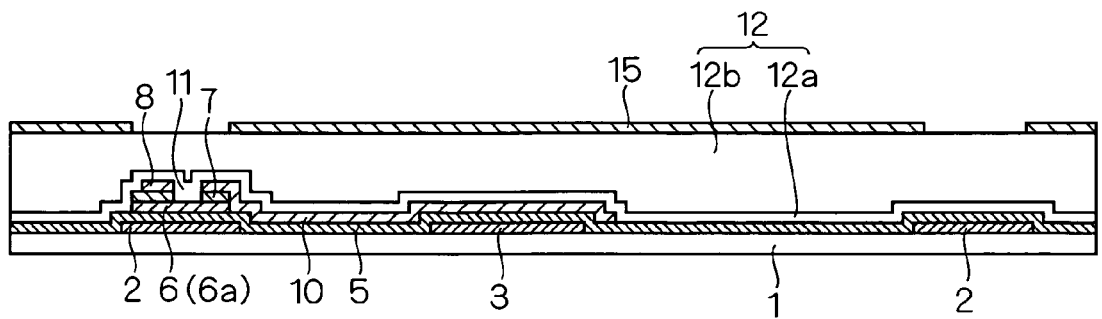
FIG. 3 is a cross-sectional view taken along line B-B of FIG. 1.

FIG. 1 is a plan view of an active matrix substrate; FIG. 2 is a cross-sectional view taken along line A-A of FIG. 1; and FIG. 3 is a cross-sectional view taken along line B-B of FIG. 1.

Figure 9A:
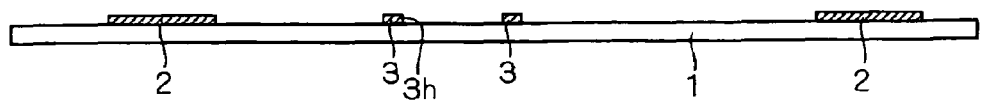
FIGS. 9A to 9E are cross-sectional views showing the steps in the above manufacturing method, taken along line A-A of FIG. 1.

In this active matrix substrate, a plurality of gate lines 2 (scanning lines) and a plurality of auxiliary capacitive electrodes 3 are formed on a transparent insulated substrate 1 (cf. FIGS. 4 and 9A). The plurality of gate lines 2 are formed in straight lines and spaced at appropriate intervals to extend approximately parallel to each other on the transparent insulated substrate 1. Portions of the gate lines 2 on which a semiconductor film 6 to be described later is formed serve as gate electrodes of thin-film transistors.

Each of the auxiliary capacitive electrodes 3 is formed in an area surrounded by each of the gate lines 2 and each of source lines 9 (signal lines) which will be described later (cf. FIGS. 4 and 9A). In the present example, each of the auxiliary capacitive electrodes 3 is provided at about the center of two adjacent gate lines 2 and formed roughly in the shape of a rectangle extending along a direction of extension of the gate lines 2 in plan view. Further, each of the auxiliary capacitive electrodes 3 is coupled and connected to adjacent auxiliary capacitive electrodes 3 in the direction of extension of the gate lines 2. The auxiliary capacitive electrodes 3 each have a hole 3h formed therethrough.

Each of the auxiliary capacitive electrodes 3 is opposed to part of each of drain electrodes 10, which will be described later, with a first interlayer insulating film 5 in between. Then, the auxiliary capacitive electrodes 3 and parts of the drain electrodes 10 form electrical (holding) capacitances. This allows retention of display signal potential applied to pixel electrodes 15, which will be described later, thereby achieving a stable display.

Figure 5:
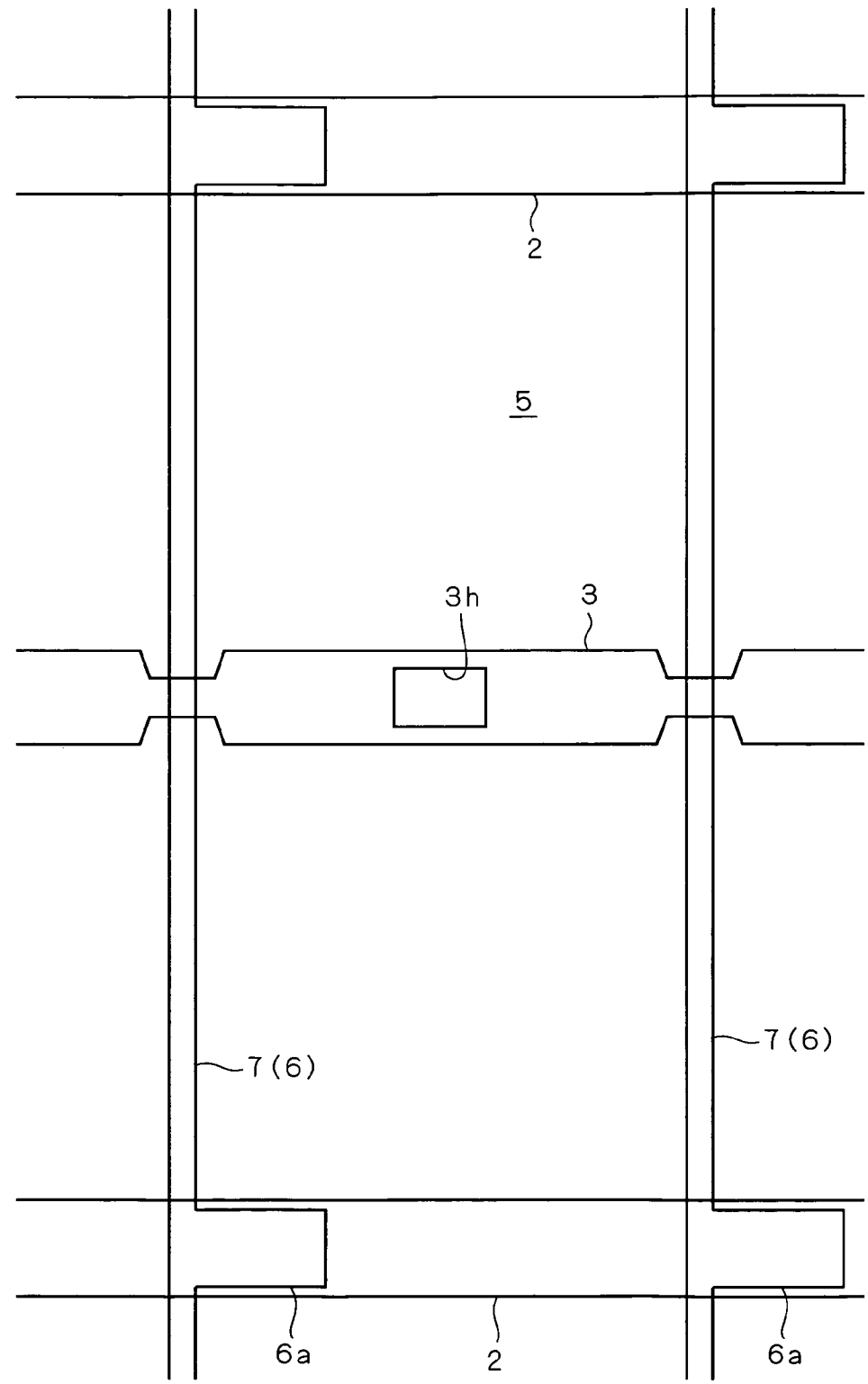
Figure 9B:
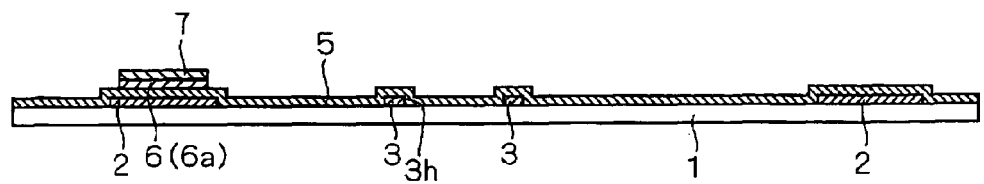

Further, the first interlayer insulating film 5 is formed to cover the gate lines 2 and the auxiliary capacitive electrodes 3 on the transparent insulated substrate 1 (cf. FIGS. 5 and 9B). On this first interlayer insulating film 5, the semiconductor film 6 and an ohmic contact film 7 are formed (cf. FIGS. 5 and 9B). The semiconductor film 6 is formed approximately in straight lines, and a plurality of lines of the semiconductor film 6 are formed approximately parallel to each other in a direction generally orthogonal to the gate lines 2. The semiconductor film 6 has semiconductor forming parts 6a which extend along the direction of extension of the gate lines 2, at the intersections of the semiconductor film 6 and the gate lines 2. On the semiconductor film 6, the ohmic contact film 7 is formed.

One side edges of the semiconductor forming parts 6a are connected to source electrodes 8 which will be described later, and the other side edges are connected to the drain electrodes 10 which will be described later. Further, channel regions 11 are formed at about the centers of the semiconductor forming parts 6a. This constitutes thin-film transistors (TFT) serving as switching elements.

In this preferred embodiment, semiconductor patterns including the semiconductor film 6 and the ohmic contact film 7 extend under and along the source lines 9. That is, the semiconductor patterns extend not only at the intersections of the gate lines 2 and the source lines 9 forming thin-film transistors, but also extend under the source lines 9. Thus, even in the case of a break in any source line 9, a semiconductor pattern extending under that source line 9 serves as a redundant line for the source line 9, thereby preventing an interruption of electrical signals.

Figure 6:
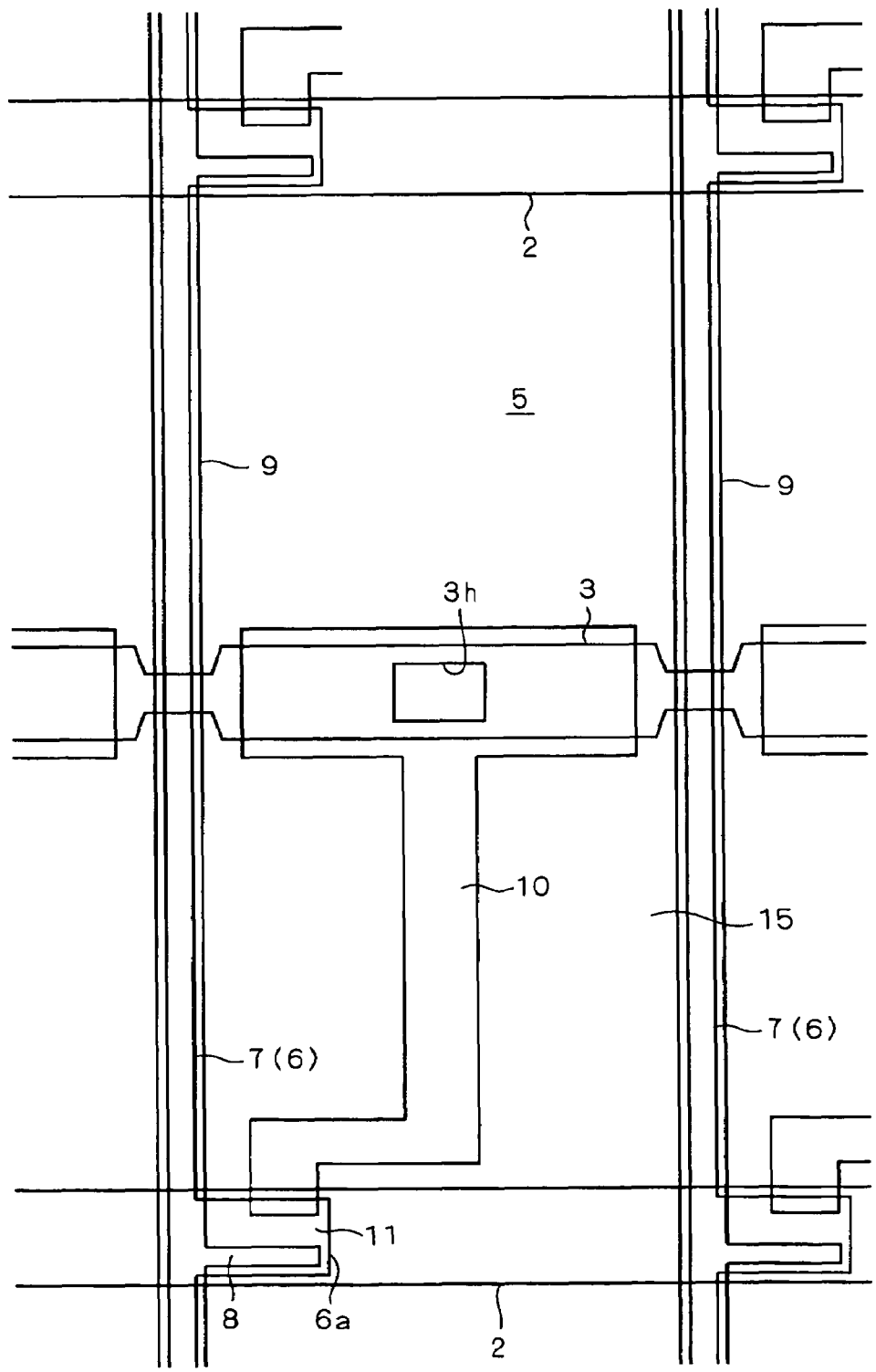
Figure 9C:
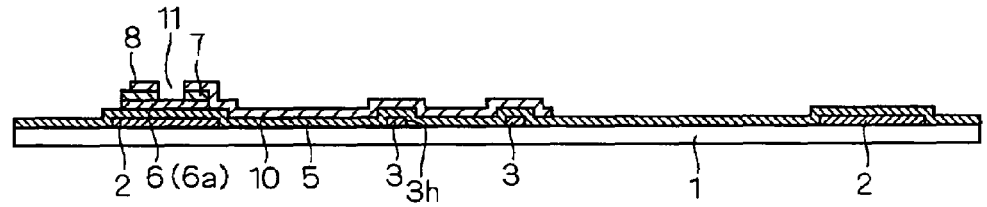

The source lines 9 and the drain electrodes 10 are formed on the first interlayer insulating film 5 (cf. FIGS. 6 and 9C). The plurality of source lines 9 are formed approximately in straight lines and extend approximately parallel to each other along a direction intersecting with the gate lines 2. In the present example, the source lines 9 are formed on the semiconductor film 6 and the gate lines 2. At the intersections of the source lines 9 and the gate lines 2, the source electrodes 8 extend along the direction of extension of the gate lines 2. Those source electrodes 8 are connected on one side edges of the semiconductor forming parts 6a.

The drain electrodes 10 are formed to extend over the auxiliary capacitive electrodes 3 to the other side edges of the semiconductor forming parts 6a. In the present example, the drain electrodes 10 are formed approximately in the shape of the letter T in plan view, and their portions extending in the direction of their widths extend over the auxiliary capacitive electrodes 3 to face the auxiliary capacitive electrodes 3 with the first interlayer insulating film 5 in between. Those portions of the drain electrodes 10 and the auxiliary capacitive electrodes 3 form electrical (holding) capacitances for the pixel electrodes 15 which will be described later.

Figure 7:
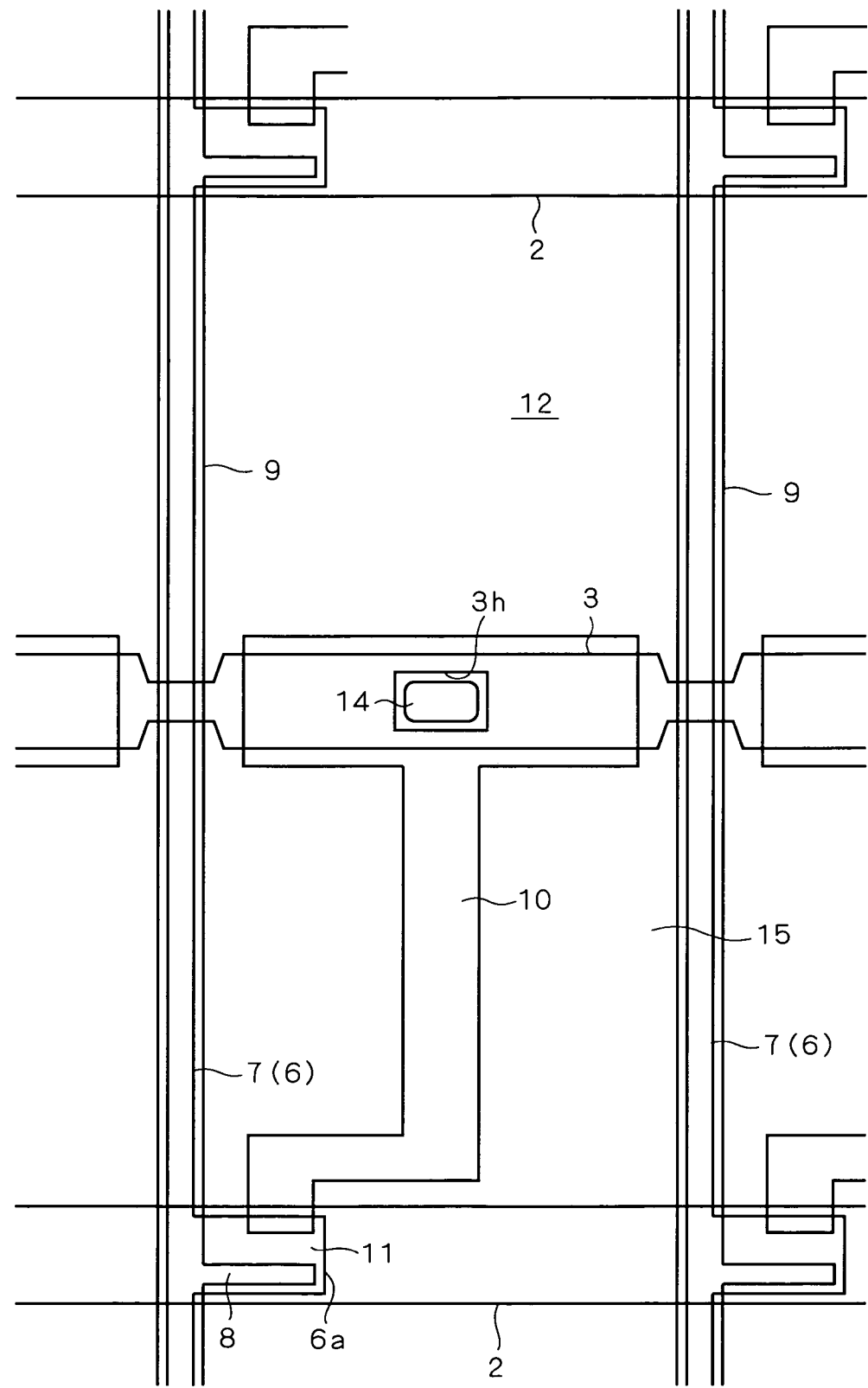
Figure 9D:
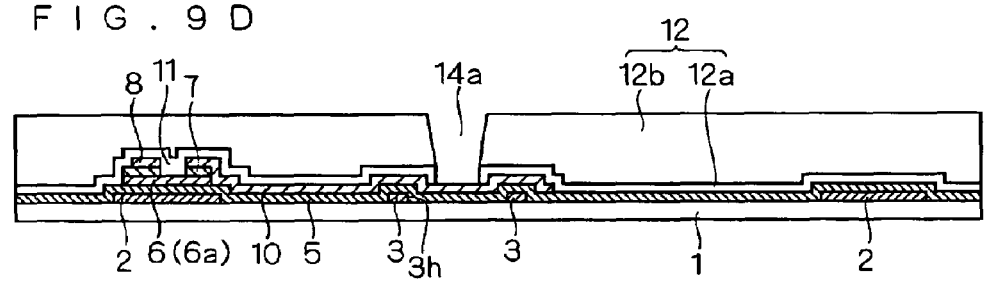

Further, a second interlayer insulating film 12 is formed to cover the first interlayer insulating film 5, the semiconductor patterns, the source electrodes 8, the source lines 9, and the drain electrodes 10 (cf. FIGS. 7 and 9D). This second interlayer insulating film 12 is formed to provide a flat surface.

This second interlayer insulating film 12 has contact holes 14 formed therein. The contact holes 14 extend through the second interlayer insulating film 12 to reach the drain electrodes 10 (cf. FIGS. 7 and 9D).

Specifically, the contact holes 14 reach the drain electrodes 10 in areas surrounded by areas where the auxiliary capacitive electrodes 3 are formed, but not in the areas where the auxiliary capacitive electrodes 3 are formed. In the present example, the contact holes 14 are formed to reach the drain electrodes 10 in areas corresponding to the areas of the holes 3h formed in the auxiliary capacitive electrodes 3. Here, surrounding the contact holes 14 by the areas where the auxiliary capacitive electrodes 3 are formed refers not only to a form that the whole contact portions of the contact holes 14 with the drain electrodes 10 is surrounded from all directions by the areas where the auxiliary capacitive electrodes 3 are formed, but also to a form that the whole or part of the contact portions of the contact holes 14 with the drain electrodes 10 is surrounded from two or three directions by the areas where the auxiliary capacitive electrodes 3 are formed.

In other words, in order to ensure sufficient auxiliary capacities for the pixel electrodes 15, the contact holes 14 are formed to reach the drain electrodes 10 in areas in which they overlap areas where the auxiliary capacitive electrodes 3 are to be formed. The actual auxiliary capacitive electrodes 3 are formed to avoid the areas where the contact holes 14 reach the drain electrodes 10. That is, the holes 3h are formed.

Figure 9E:
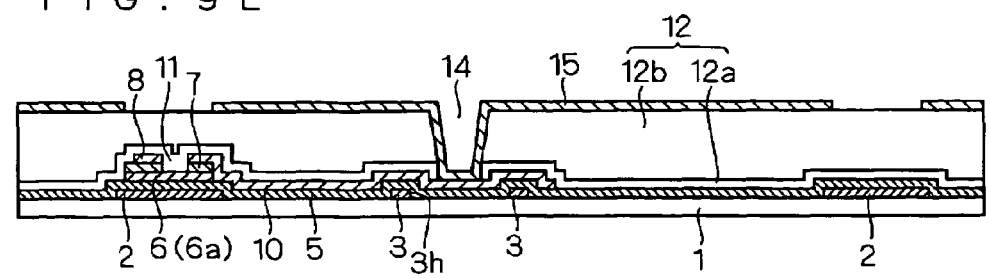

Further, the pixel electrodes 15 are formed on the surface of the second interlayer insulating film 12 (cf. FIGS. 8 and 9E). In the present example, the pixel electrodes 15 are formed to extend almost across an entire generally rectangular area surrounded by the gate lines 2 and the source lines 9. Those pixel electrodes 15 are connected to the drain electrodes 10 through the contact holes 14.

Now, a method of manufacturing the active matrix substrate with the above configuration will be described. FIGS. 4 to 8 are plan views showing the steps in the manufacturing method; and FIGS. 9A to 9E are cross-sectional views showing the steps in the manufacturing method, taken along line A-A of FIG. 1.

First, as shown in FIGS. 4 and 9A, the gate lines 2 and the auxiliary capacitive electrodes 3 are formed on the transparent insulated substrate 1 serving as a substrate.

That is, a first thin metal film is formed on the transparent insulated substrate 1 such as a glass substrate, and the gate lines 2 and the auxiliary capacitive electrodes 3 are formed by a first photolithography process. At this time, the hole 3h is formed in each of the auxiliary capacitive electrodes 3.

More specifically, a chromium (Cr) film as the above thin metal film is formed to a thickness of, for example, 200 nm using known techniques such as sputtering using argon (Ar) gas. The sputtering condition here is, for example, a DC magnetron sputtering technique with the film-deposition power density of 3 W/cm$^2$ and the Ar gas flow rate of 40 sccm.

In the subsequent photolithography process, a photoresist pattern is formed, the chromium film is etched using a known solution containing ammonium cerium nitrate, and the photoresist pattern is removed. Thereby, the gate lines 2 and the auxiliary capacitive electrodes 3 are formed.

Next, as shown in FIGS. 5 and 9B, the first interlayer insulating film 5, the semiconductor film 6, and the ohmic contact film 7 are formed.

That is, the first interlayer insulating film 5 is formed to cover the gate lines 2 and the auxiliary capacitive electrodes 3 on the transparent insulated substrate 1. Then, a film of semiconductor and a film of ohmic contact are formed sequentially. Then, a second photolithography process removes parts of the film of semiconductor and the film of ohmic contact, thereby forming semiconductor patterns consisting of the semiconductor film 6 and the ohmic contact film 7 for forming thin-film transistors (TFTs) serving as switching elements.

More specifically, for example by chemical vapor deposition (CVD), a silicon nitride (SiNx: x is a positive number) film as the first interlayer insulating film 5 is formed to a thickness of 400 nm, an amorphous silicon (a-Si) film as the film of semiconductor is formed to a thickness of 150 nm, and an n$^+$ a-Si film doped with phosphorus (P) impurities as the film of ohmic contact is formed to a thickness of 30 nm, sequentially in this order. Then, after a photoresist pattern is formed by photolithography, the a-Si film and the n$^+$ a-Si film are etched using known techniques such as dry etching using fluorine gas. After that, the photoresist pattern is removed to form semiconductor patterns of a predetermined shape including the semiconductor film 6 and the ohmic contact film 7. The channel regions 11 in the semiconductor forming parts 6a will be formed in a subsequent process.

Next, as shown in FIGS. 6 and 9C, the source lines 9, the source electrodes 8, and the drain electrodes 10 are formed on the first interlayer insulating film 5.

That is, a second thin metal film is formed to cover the first interlayer insulating film 5 and the semiconductor patterns. Then, the source lines 9, the source electrodes 8, and the drain electrodes 10 are formed by a third photolithography process.

More specifically, a chromium film is formed to a thickness of 200 nm for example by sputtering, and a photoresist pattern is formed by photolithography. Then, the chromium film is etched using a solution containing ammonium cerium nitrate to form the source electrodes 8, the source lines 9, and the drain electrodes 10. Further, the n$^+$ a-Si film (ohmic contact film 7) between the source electrodes 8 and the drain electrodes 10 is etched using known techniques such as dry etching using fluorine gas, thereby to form the channel regions 11 of the thin-film transistors. After that, the photoresist pattern is removed.

Next, as shown in FIGS. 7 and 9D, the second interlayer insulating film 12 is formed, and the contact holes 14 are formed in the second interlayer insulating film 12. The second interlayer insulating film 12 is formed to cover the semiconductor patterns, the source electrodes 8, the source lines 9, and the drain electrodes 10. In the present example, a first insulating film 12a which is an inorganic insulating film is formed, and a second insulating film 12b which is an organic insulating film is formed on the first insulating film 12a, thereby to form the second interlayer insulating film 12 with a two-layered structure. Alternatively, the second interlayer insulating film 12 may be of a multilayered structure including other layers, or a single-layer structure of an inorganic insulating film such as silicon nitride or silicon oxide. The contact holes 14 are formed with bottom surfaces, extending from the surface of the second interlayer insulating film 12 to the surfaces of the drain electrodes 10. Those contact holes 14 are formed to reach the drain electrodes 10 in areas above the holes 3h formed in the auxiliary capacitive electrodes 3.

More specifically, for example, an inorganic insulating film such as SiNx (x is a positive number) is formed to a thickness of 100 nm as the first insulating film 12a. Then, using techniques such as spin coating, a photosensitive organic resin (e.g., a resin material with the manufacturer's part number PC335 developed by JSR Corporation) is coated with a thickness of 3.2 to 3.9 μm to form the second insulating film 12b of photosensitive organic resin. Then, contact holes 14a are formed in the second insulating film 12b of photosensitive organic resin by a fourth photolithography process (the contact holes 14a at this stage are shown in FIG. 9D). Those contact holes 14a are formed at positions above the holes 3h of the auxiliary capacitive electrodes 3. Then, the first insulating film (SiNx) 12a under the contact holes 14a is etched and removed using known techniques such as dry etching using fluorine gas. This forms the contact holes 14 which extend through the first and second insulating films 12a and 12b to reach the drain electrodes 10 in areas corresponding to the areas of the holes 3h, i.e., in areas where the auxiliary capacitive electrodes 3 are not formed.

Finally, as shown in FIGS. 8 and 9E, the plurality of pixel electrodes 15 are formed on the second interlayer insulating film 12 to be connected to corresponding drain electrodes 10 through the contact holes 14.

More specifically, a transparent conductive film is first formed on the second interlayer insulating film 12 and on the inner surfaces of the contact holes 14 extending to the drain electrodes 10. The transparent conductive film is obtained by for example forming Indium-Tin oxide (ITO) containing indium oxide ($In_2O_3$) and Tin oxide ($SnO_2$) to a thickness of 100 nm using techniques such as sputtering. In a subsequent fifth photolithography process, after formation of a photoresist pattern, the transparent conductive film is etched using a known solution containing hydrochloric acid and nitric acid, and then the photoresist pattern is removed. This forms the transparent pixel electrodes 15. Those pixel electrodes 15 are connected to the drain electrodes 10 through the contact holes 14.

Through the aforementioned steps, a TFT active matrix substrate is manufactured. As opposed to this active matrix substrate, another substrate is placed which includes light-shielding plates, color filters, opposed electrodes, orientation films, and the like, and a liquid crystal layer is placed between those substrates. This produces a liquid crystal display.

The active matrix substrate with the aforementioned configuration and its manufacturing method can achieve a high aperture ratio while preventing electrical short circuits between the pixel electrodes 15 and the auxiliary capacitive electrodes 3.

The effect of preventing electrical short circuits between the pixel electrodes 15 and the auxiliary capacitive electrodes 3 will be described with reference to FIGS. 10A to 10F and FIGS. 11A to 11F. FIGS. 10A to 10F are cross-sectional views showing the steps, taken along line A-A of FIG. 1, and FIGS. 11A to 11F are cross-sectional views showing the steps, taken along line B-B of FIG. 1.

Figure 10A:
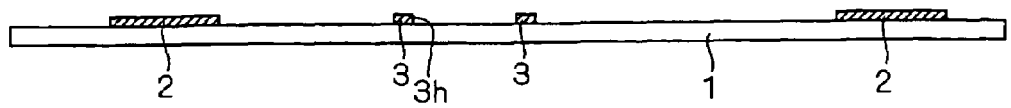
FIGS. 10A to 10F are cross-sectional views showing the steps, taken along line A-A of FIG. 1.
Figure 10B:
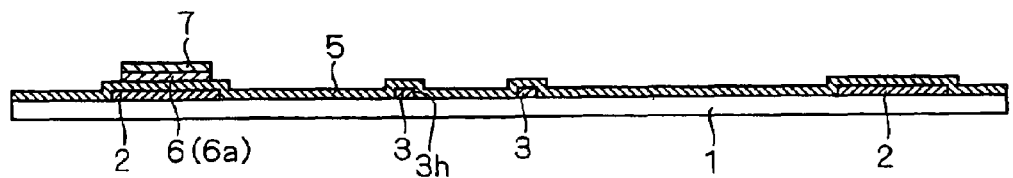
Figure 10C:
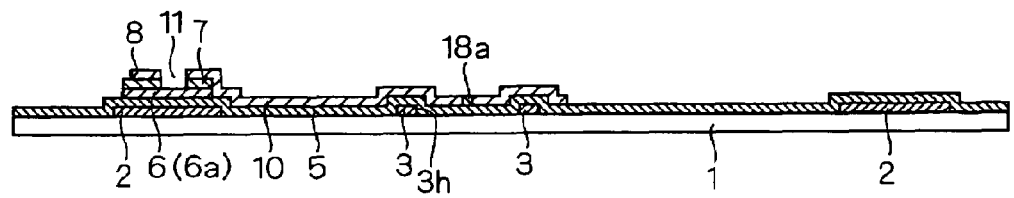
Figure 10D:
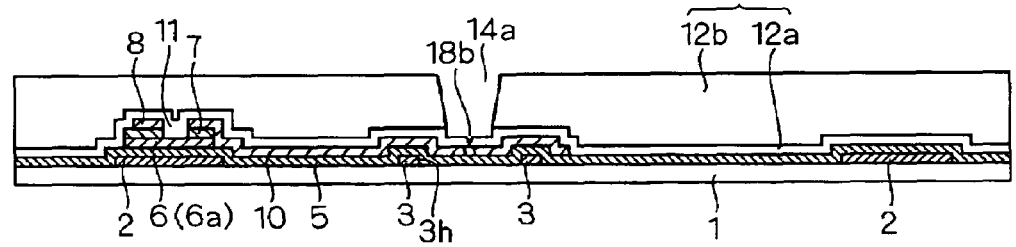
Figure 10E:
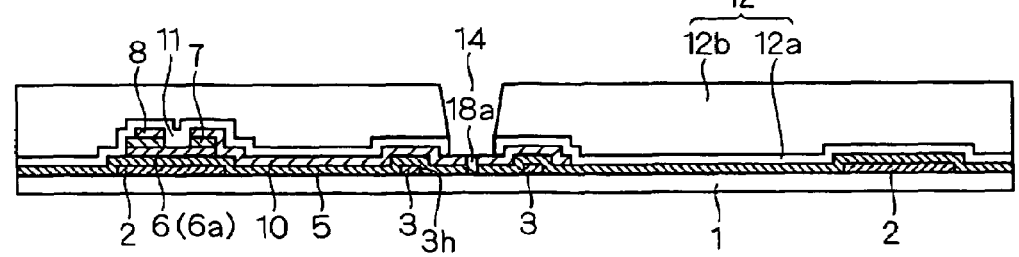
Figure 11A:
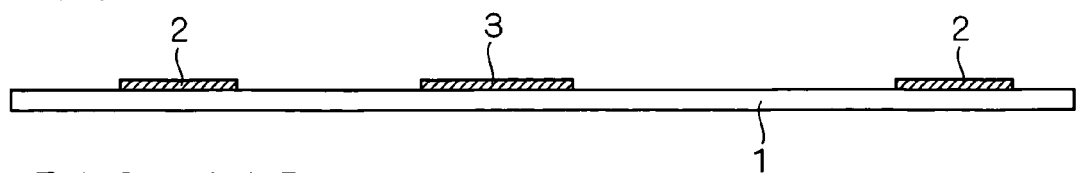
FIGS. 11A to 11F are cross-sectional views showing the steps, taken along line B-B of FIG. 1.
Figure 11B:
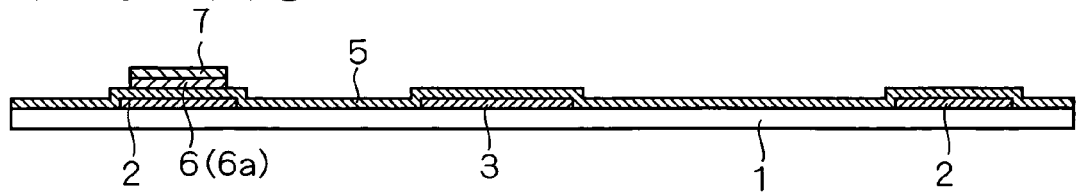
Figure 11C:
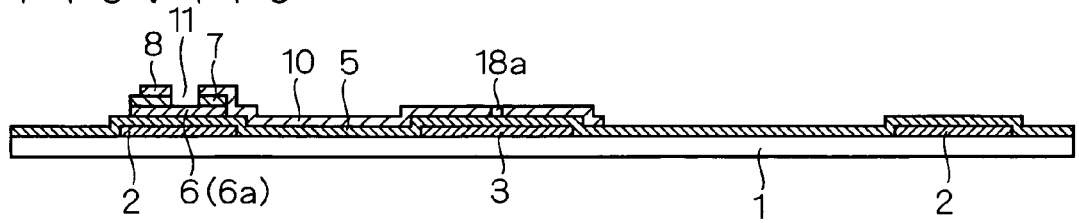
Figure 11D:
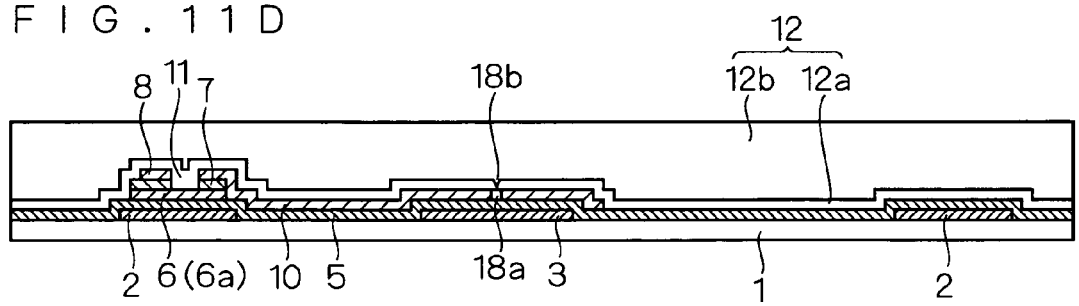
Figure 11E:
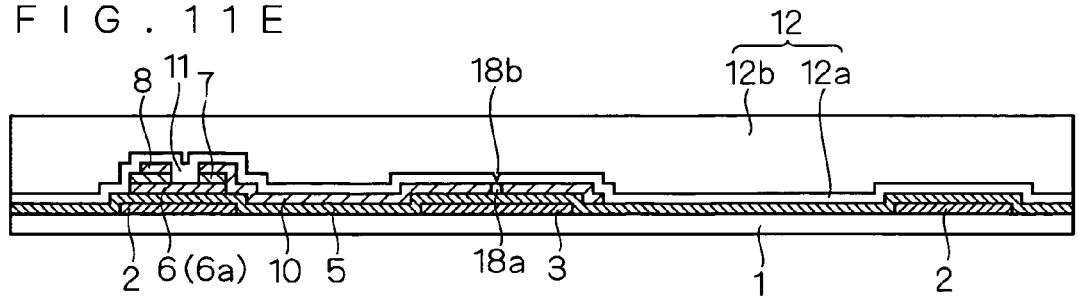

In the manufacture of active matrix substrates, defects such as a chipped part of film or a pin hole 18a may be caused in part of the drain electrodes 10 as shown in FIG. 10C or 11C. Such defects can be caused for example by any particles or dust produced during the formation of the second thin metal film. The presence of such a chipped part of film or a pin hole 18a in part of the drain electrodes 10 results in a poor coverage portion 18b of the first insulating film (SiNx) 12a formed thereon as shown in FIG. 10D or 11D. Then, after the contact holes 14a are formed in the second insulating film 12b of for example photosensitive organic resin, the first insulating film 12a under the contact holes 14a is etched and removed using techniques such as dry etching using fluorine gas, as shown in FIGS. 10E and 11E. At this time, the fluorine gas reaches the underlying first interlayer insulating film 5 through the pin holes 18a or the like, so that the first interlayer insulating film 5 under the contact holes 14 is partly removed. That is, the contact holes 14 are formed extending from the surface of the second interlayer insulating film 12 through the pin holes 18a of the drain electrodes 10 to reach the first interlayer insulating film 5.

In this case, if the auxiliary capacitive electrodes 3 were located under the contact holes 14 as in conventional active matrix substrates (in other words, if the auxiliary capacitive electrodes 3 had no holes 3h), the pixel electrodes 15 are connected to both the drain electrodes 10 and the auxiliary capacitive electrodes 3 through the contact holes 14. This inhibits retention of potential between the drain electrodes 10 and the auxiliary capacitive electrodes 3 opposed to each other, thereby causing display defects at the corresponding pixel electrodes 15.

Figure 10F:
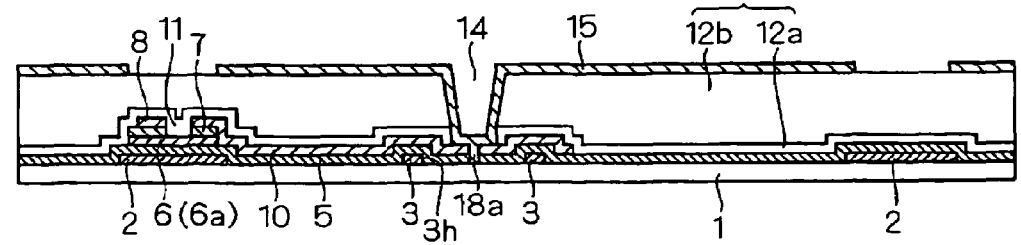

On the other hand, in the active matrix substrate according to this preferred embodiment, the contact holes 14 are formed to reach the drain electrodes 10 except in areas where the auxiliary capacitive electrodes 3 are formed. That is, the auxiliary capacitive electrodes 3 are not placed under the contact holes 14. Thus, even if the drain electrodes 10 have pin holes 18a or the like and thereby the underlying first interlayer insulating film 5 is etched in part, the result is that only the further underlying transparent insulated substrate 1 is exposed below the contact holes 14. Accordingly, as shown in FIG. 10F, the pixel electrodes 15 are connected only to the drain electrodes 10 through the contact holes 14. This prevents a situation such as short circuits with the auxiliary capacitive electrodes 3.

Figure 11F:
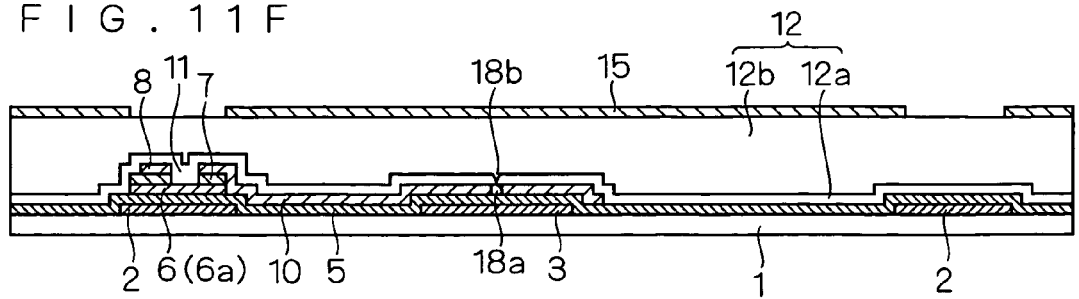

Besides, as shown in FIG. 11F, in the area where the contact holes 14 are not formed, the drain electrodes 10 and the auxiliary capacitive electrodes 3 are opposed to each other through the first interlayer insulating film 5 to form electrical (holding) capacitances therebetween. This properly maintains a signal potential applied to the pixel electrodes 15 and thereby prevents the occurrence of display defects.

Especially since the auxiliary capacitive electrodes 3 have holes 3h and are formed in such a manner that the outer edges of their holes 3h are opposed to the drain electrodes 10 around the contact portions of the pixel electrodes 15 and the drain electrodes 10, it is possible to form sufficient electrical (holding) capacitances for the pixel electrodes 15 as well as to effectively prevent electrical short circuits between the pixel electrodes 15 and the auxiliary capacitive electrodes 3.

Further, as shown in FIG. 11C, even if the drain electrodes 10 have chipped parts of film or pin holes 18a in the area where the contact holes 14 are not formed, the contact holes 14 themselves are not formed in such areas and thus the first interlayer insulating film 5 will not be etched. This prevents short circuits between the drain electrodes 10 and the auxiliary capacitive electrodes 3.

Furthermore, the poor coverage portion 18b that may be caused in the first insulating film (SiNx) 12a is completely covered with the second insulating film 12b of for example photosensitive organic resin provided thereon. This also prevents electrical short circuits between the pixel electrodes 15 and the auxiliary capacitive electrodes 3 or between the drain electrodes 10 and the auxiliary capacitive electrodes 3.

Since, as a matter of course, the pixel electrodes 15 can be placed to overlap the various types of signal lines such as the gate lines 2 and the source lines 9, a high aperture ratio can also be achieved.

As so far described, this preferred embodiment can prevent display defects resulting from electrical short circuits between the pixel electrodes 15 and the auxiliary capacitive electrodes 3 and thus can provide an active matrix substrate with a high yield. Further, the use of this active matrix substrate achieves a display with a high aperture ratio and excellent display properties.

A problem, such as extension of the contact holes 14 to the auxiliary capacitive electrodes 3, is likely to be caused especially if the first interlayer insulating film 5 is an inorganic insulating film containing silicon nitride or silicon oxide. More specifically, the above problem is likely to be caused for example if the first interlayer insulating film 5 is an inorganic insulating film containing silicon nitride or silicon oxide and if the second interlayer insulating film 12 is an inorganic insulating film containing silicon nitride or silicon oxide, or a multilayer film consisting of an underlying layer of an inorganic insulating film containing silicon nitride or silicon oxide and an insulating layer formed on the underlying layer. This is because, in such a case, the first interlayer insulating film 5 might be etched through pin holes or the like during the process of etching the inorganic insulating film of the second interlayer insulating film 12. Thus, the present invention is especially effective in the case of layered structures as described above.

Second Preferred Embodiment

Now, an active matrix substrate according to a second preferred embodiment of the present invention will be described. This preferred embodiment describes an active matrix substrate for use in semitransparent liquid crystal displays.

Figure 12:
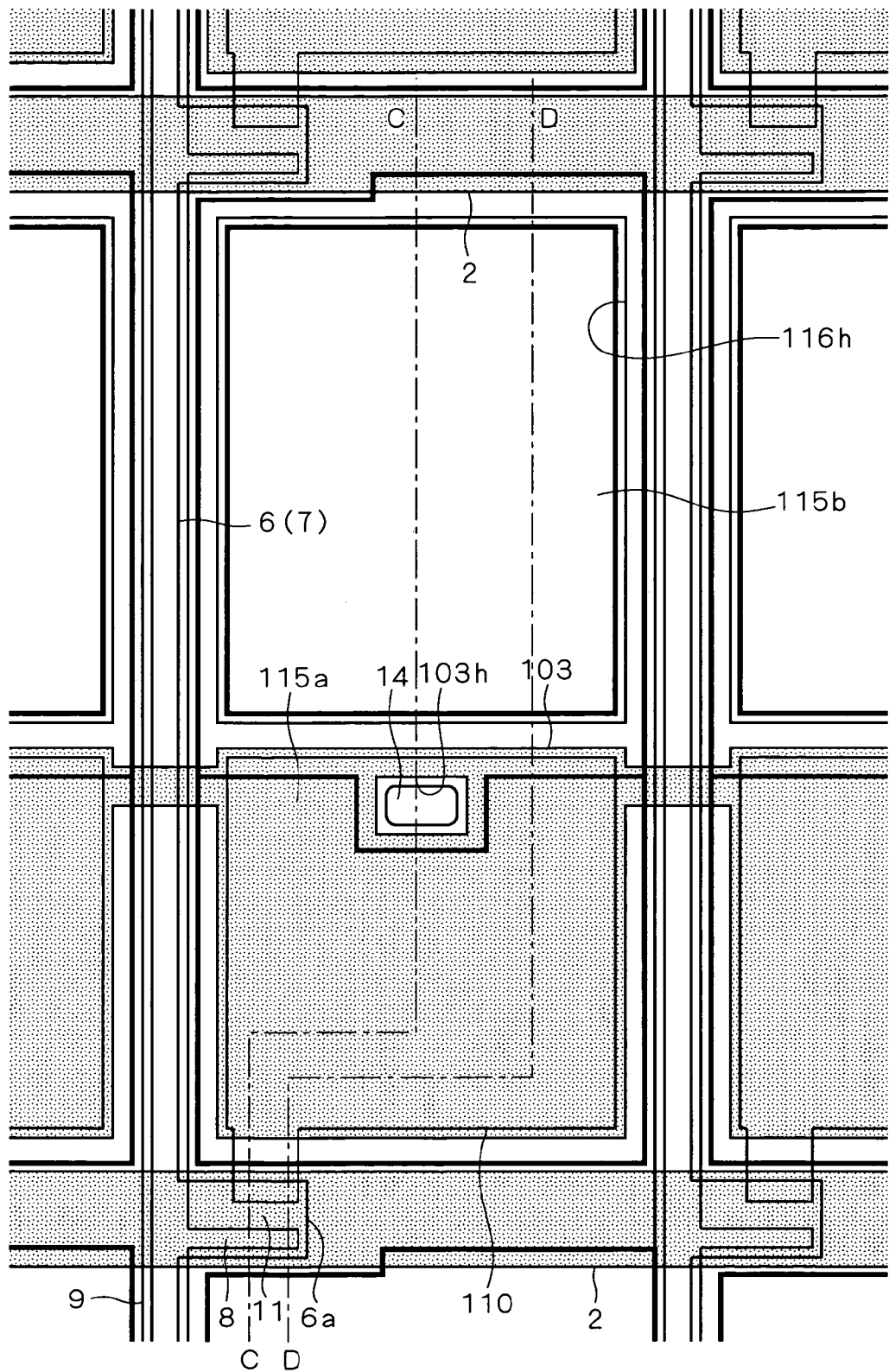
FIG. 12 is a plan view of an active matrix substrate according to a second preferred embodiment.
Figure 13:
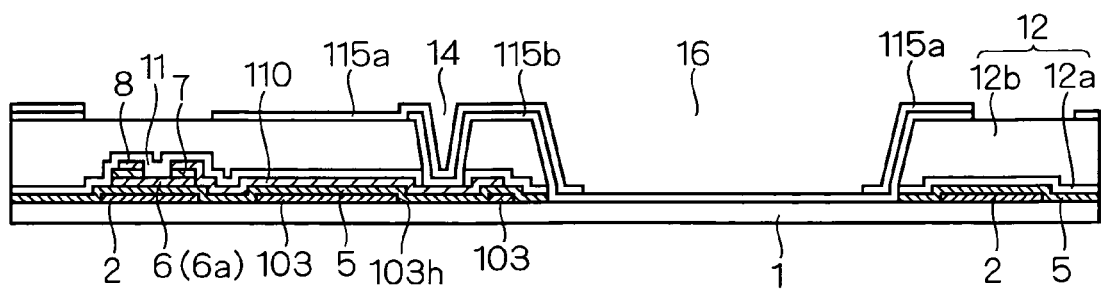
FIG. 13 is a cross-sectional view taken along line C-C of FIG. 12.
Figure 14:
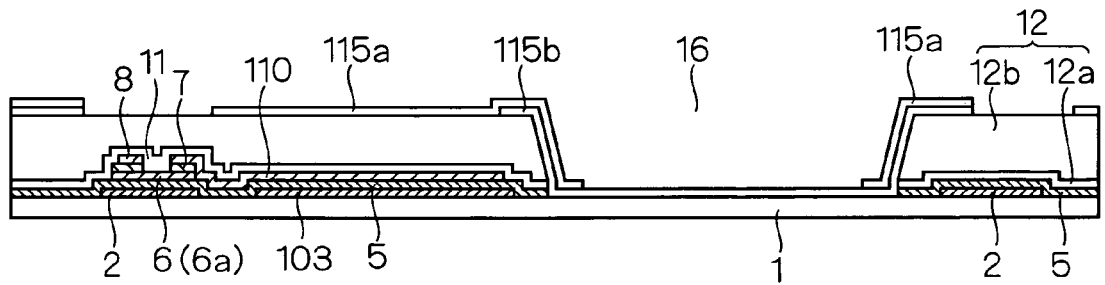
FIG. 14 is a cross-sectional view taken along line D-D of FIG. 12.

FIG. 12 is a plan view of an active matrix substrate; FIG. 13 is a cross-sectional view taken along line C-C of FIG. 12; and FIG. 14 is a cross-sectional view taken along line D-D of FIG. 12.

The following is a description of main differences of the active matrix substrate according to this second preferred embodiment from the one according to the first preferred embodiment. Here, components identical to those according to the aforementioned first preferred embodiment are denoted by the same reference numerals, which will not be described in detail.

While in the first preferred embodiment, the pixel electrodes 15 are formed of only a transparent conductive film, pixel electrode sections for pixel display in the second preferred embodiment consist of two kinds of pixel electrodes: reflecting pixel electrodes 115a of a reflection film; and transparent pixel electrodes 115b of a transparent film. In the present example, the transparent pixel electrodes 115b are formed in areas constituting approximately a half (more specifically, more than the upper half) of the pixel electrode sections, and the reflecting pixel electrodes 115a are formed in areas constituting approximately another half (more specifically, less than the lower half) of the pixel electrode sections and surrounding the transparent pixel electrodes 115b (cf. FIGS. 20 and 21G). The reflecting pixel electrodes 115a and the transparent pixel electrodes 115b overlap each other in areas where the contact holes 14 are formed, at the boundaries therebetween, and at the peripheries of the transparent pixel electrodes 115b.

Further, while in the first preferred embodiment, the auxiliary capacitive electrodes 3 are formed in lines at about the centers of the pixel electrodes 15 in order not to interfere with light transmission as much as possible, auxiliary capacitive electrodes 103 in the second preferred embodiment are formed almost across the entire area of the reflecting pixel electrodes 115a. In the auxiliary capacitive electrodes 103, holes 103h are formed at about the centers of the pixel electrode sections for pixel display (cf. FIGS. 15 and 21A).

Figure 17:
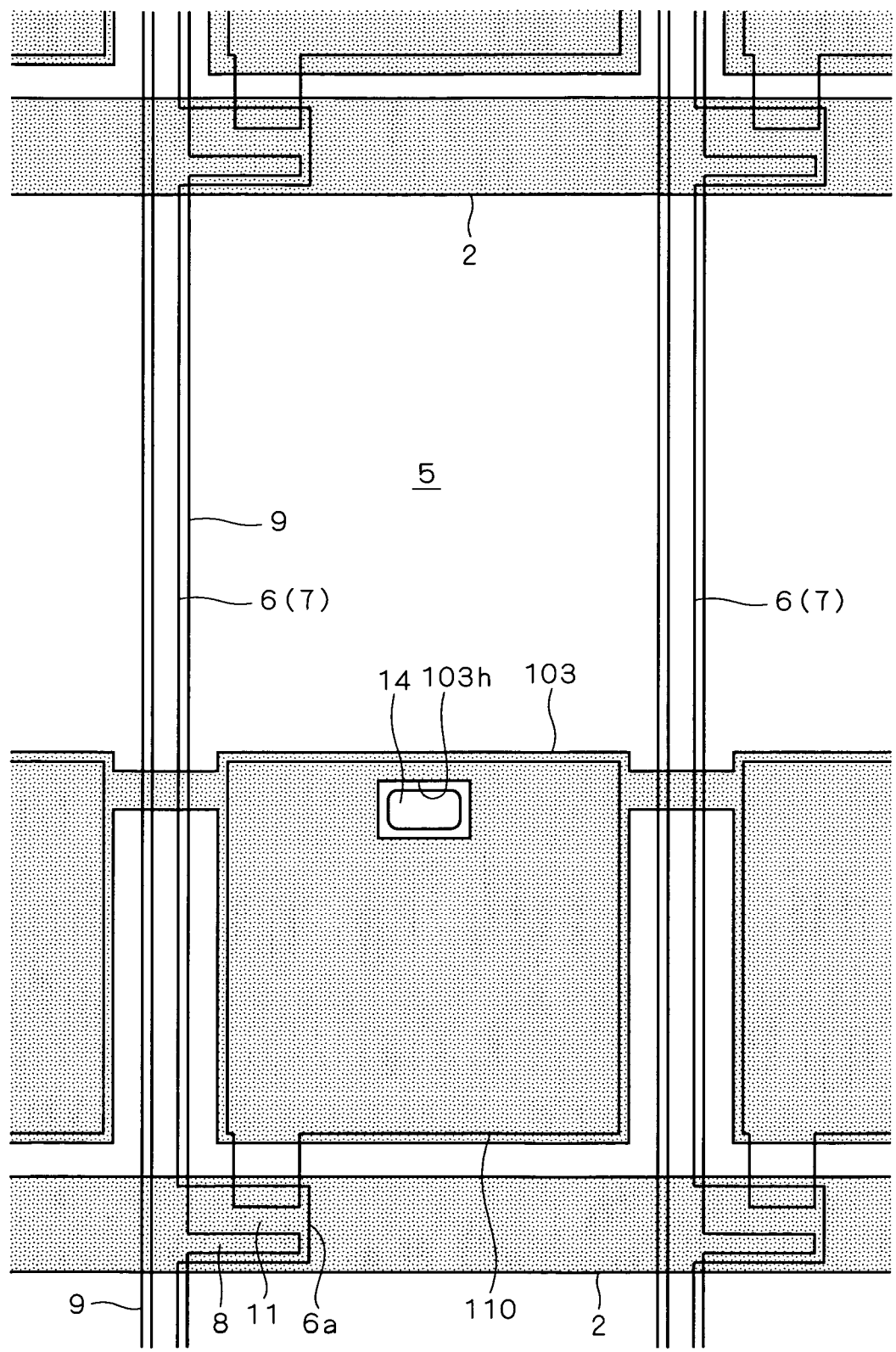
Figure 21A:
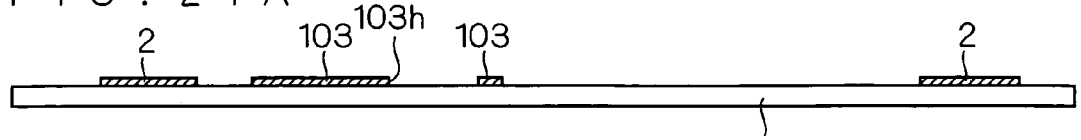
FIGS. 21A to 21G are cross-sectional views showing the steps in the above manufacturing method, taken along line A-A of FIG. 1.
Figure 21B:
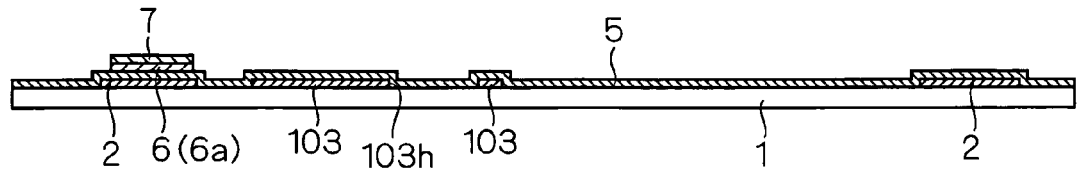
Figure 21C:
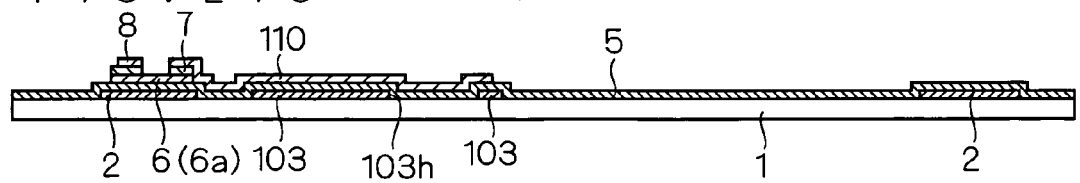

Further, drain electrodes 110 are formed to extend almost across the entire areas of the auxiliary capacitive electrodes 103 (cf. FIGS. 17 and 21C).

Figure 21D:
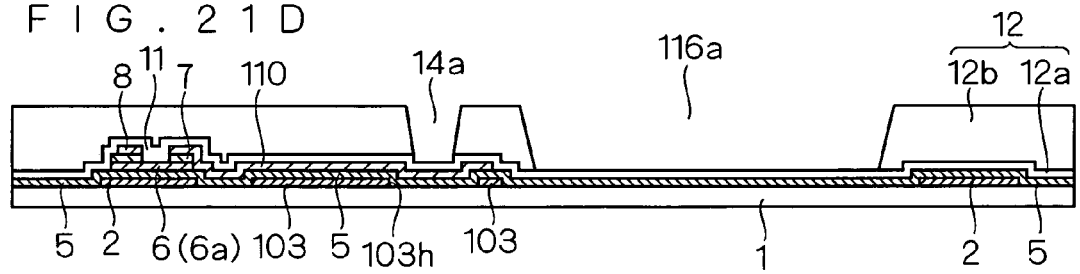
Figure 21E:
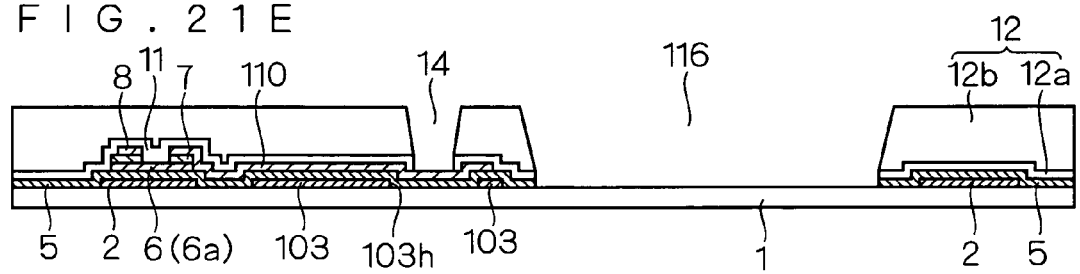
Figure 21F:
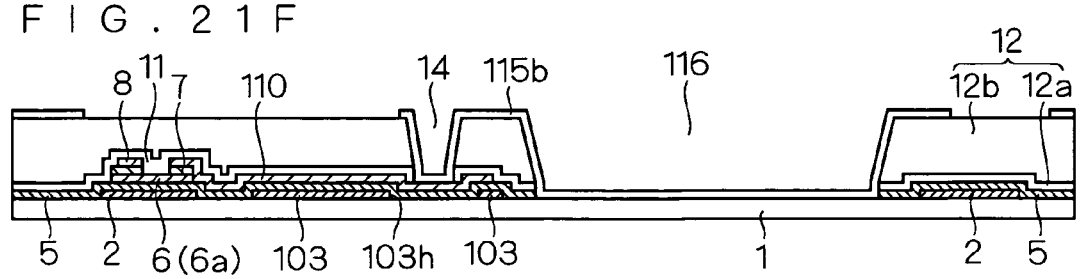
Figure 21G:
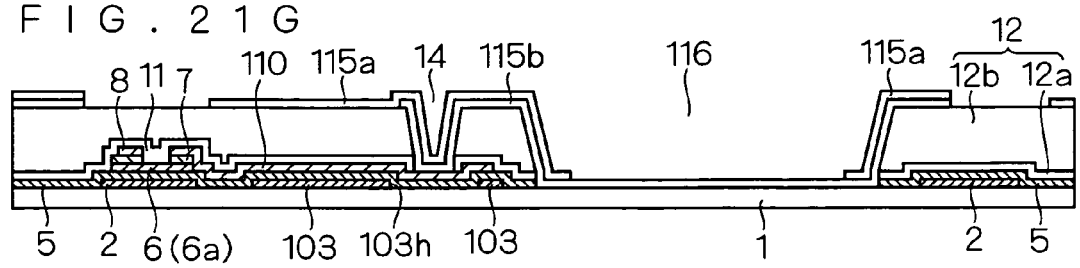

In the areas forming the transparent pixel electrodes 115b, the first interlayer insulating film 5 and the second interlayer insulating film 12 are removed so that the transparent pixel electrodes 115b are formed in direct contact with the transparent insulated substrate 1 (cf. FIGS. 21F and 21G).

This active matrix substrate allows the auxiliary capacitive electrodes 103 to be formed across the entire areas of the reflecting pixel electrodes 115a for reflecting light. That is, since the transparent pixel electrodes 115b use transmitted light for image display, provision of lightproof electrodes in a layer underlying those electrodes must be avoided as much as possible. On the other hand, since the reflecting pixel electrodes 115a use light reflection for image display, the formation of the lightproof auxiliary capacitive electrodes 103 in a layer underlying those electrodes is not a problem. Thus, the auxiliary capacitive electrodes 103 can be formed across the entire areas of the reflecting pixel electrodes 115a. This increases the areas of the auxiliary capacitive electrodes 103 and accordingly increases the holding capacity of signal potential for pixel display, thereby allowing an improvement in display quality.

Now, a manufacturing method of this active matrix substrate will be described. FIGS. 15 to 20 are plan views showing the steps in this manufacturing method, and FIGS. 21A to 21G are cross-sectional views showing the steps in the manufacturing method, taken along line C-C of FIG. 12.

First, as shown in FIGS. 15 and 21A, the gate lines 2 and the auxiliary capacitive electrodes 103 are formed on the transparent insulated substrate 1 (cf. hatched areas in FIG. 15).

That is, a first thin metal film is formed on the transparent insulated substrate 1 such as a glass substrate, and the gate lines 2 and the auxiliary capacitive electrodes 103 are formed by a first photolithography process. At this time, the holes 103h are formed in the auxiliary capacitive electrodes 103.

More specifically, a Cr film as the above thin metal film is formed to a thickness of, for example, 200 nm using known techniques such as sputtering using Ar gas. The sputtering condition here is, for example, a DC magnetron sputtering technique with the film-deposition power density of 3 W/cm$^2$ and the Ar gas flow rate of 40 sccm.

In the subsequent photolithography process, a photoresist pattern is formed, the Cr film is etched using a known solution containing ammonium cerium nitrate, and then the photoresist pattern is removed. Thereby, the gate lines 2 and the auxiliary capacitive electrodes 103 are formed.

Next, as shown in FIGS. 16 and 21B, the first interlayer insulating film 5, the semiconductor film 6, and the ohmic contact film 7 are formed.

That is, the first interlayer insulating film 5 is formed to cover the gate lines 2 and the auxiliary capacitive electrodes 103 on the transparent insulated substrate 1. Then, a film of semiconductor and a film of ohmic contact are formed sequentially. Then, a second photolithography process removes parts of the film of semiconductor and the film of ohmic contact to form semiconductor patterns consisting of the semiconductor film 6 and the ohmic contact film 7 for forming thin-film transistors (TFTs) serving as switching elements.

More specifically, for example by chemical vapor deposition (CVD), a silicon nitride (SiNx: x is a positive number) film as the first interlayer insulating film 5 is formed to a thickness of 400 nm, an amorphous silicon (a-Si) film as the film of semiconductor is formed to a thickness of 150 nm, and an n$^+$ a-Si film doped with phosphorus (P) impurities as the film of ohmic contact is formed to a thickness of 30 nm, sequentially in this order. Then, after a photoresist pattern is formed by photolithography, the a-Si film and the n$^+$ a-Si film are etched using known techniques such as dry etching using fluorine gas. Thereafter, the photoresist pattern is removed to form the semiconductor patterns of a predetermined shape including the semiconductor film 6 and the ohmic contact film 7. The channel regions 11 in the semiconductor forming parts 6a will be formed in a subsequent process.

As described in the first preferred embodiment, the semiconductor patterns including the semiconductor film 6 and the ohmic contact film 7 extend under and along the source lines 9 and thus serve as redundant lines for the source lines 9 as in the first preferred embodiment.

Next, as shown in FIGS. 17 and 21C, the source lines 9, the source electrodes 8, and the drain electrodes 110 are formed on the first interlayer insulating film 5.

That is, a second thin metal film is formed to cover the first interlayer insulating film 5 and the semiconductor patterns. Then, the source lines 9, the source electrodes 8, and the drain electrodes 110 are formed by a third photolithography process.

More specifically, a Cr film is formed to a thickness of 200 nm, for example by sputtering, and a photoresist pattern is formed by photolithography. Then, the Cr film is etched using a solution containing ammonium cerium nitrate to form the source electrodes 8, the source lines 9, and the drain electrodes 110. Further, the $n^+$ a-Si film (ohmic contact film 7) between the source electrodes 8 and the drain electrodes 110 is etched using known techniques such as dry etching using fluorine gas, thereby to form the channel regions 11 of thin-film transistors. After that, the photoresist pattern is removed.

Figure 18:
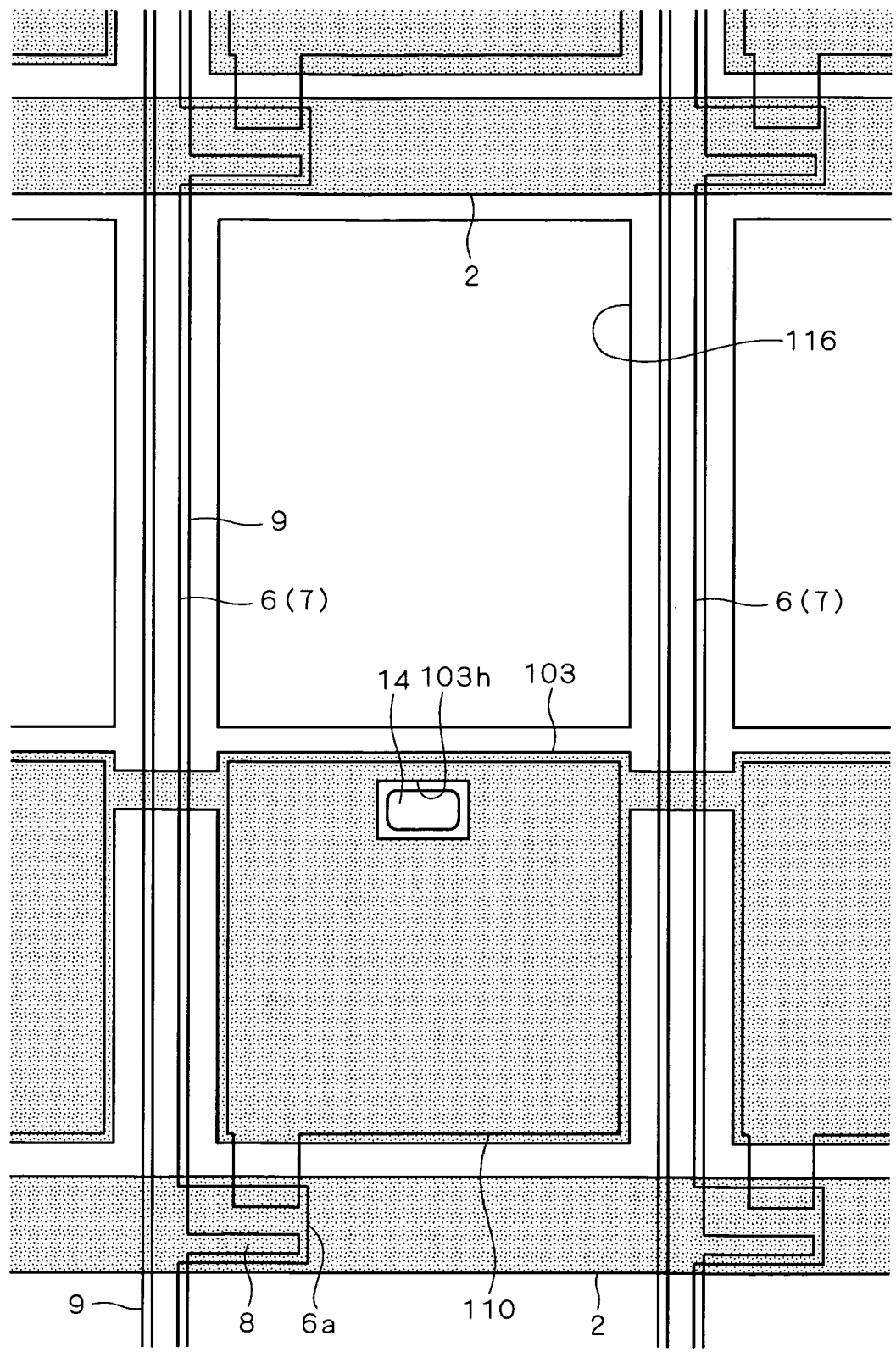

Next, as shown in FIGS. 18, 21D, and 21E, the second interlayer insulating film 12 is formed, in and through which then concave cut-out pattern holes 116a and the contact holes 14a are formed.

That is, the second interlayer insulating film 12 is formed to cover the semiconductor patterns, the source electrodes 8, the source lines 9, and the drain electrodes 110. In the present example, the first insulating film 12a, which is an inorganic insulating film, is formed, and the second insulating film 12b, which is an organic insulating film, is formed on the first insulating film 12a, thereby to form the second interlayer insulating film 12 with a two-layered structure.

The cut-out pattern holes 116 are formed by removing the first interlayer insulating film 5 and the second interlayer insulating film 12 in appropriate areas to expose the transparent insulated substrate 1 (cf. FIG. 21E).

The contact holes 14 are formed with bottom surfaces, extending from the surface of the second interlayer insulating film 12 to the surfaces of the drain electrodes 110. Those contact holes 14 are formed to reach the drain electrodes 110 in the areas above the holes 103h formed in the auxiliary capacitive electrodes 103 (cf. FIG. 21E).

More specifically, for example, an inorganic insulating film such as SiNx (x is a positive number) is formed to a thickness of 100 nm as the first insulating film 12a. Then, using techniques such as spin coating, a photosensitive organic resin (e.g., a resin material with the manufacturer's part number PC335 developed by JSR Corporation) is coated with a thickness of 3.2 to 3.9 μm to form the second insulating film 12b of photosensitive organic resin. Then, the contact holes 14a and cut-out pattern holes 116a are formed in the second insulating film 12b of photosensitive organic resin by a fourth photolithography process (the contact holes 14a and the cut-out pattern holes 116a at this stage are shown in FIG. 21D). Those contact holes 14a are formed at positions above the holes 103h of the auxiliary capacitive electrodes 103. The cut-out pattern holes 116a are formed to extend across the area where the transparent pixel electrodes 115b are formed.

Then, using known techniques such as dry etching using fluorine gas, the first insulating film (SiNx) under the contact holes 14a is etched and removed, and the first insulating film (SiNx) under the cut-out pattern holes 116a is etched and removed (cf. FIG. 21E). This forms the contact holes 14 which extend through the second interlayer insulating film 12 to reach the drain electrodes 110 in areas corresponding to the areas of the holes 103h, and also forms the cut-out pattern holes 116 which extend through the second interlayer insulating film 12 and the first interlayer insulating film 5 to reach the transparent insulated substrate 1 in areas corresponding to the transparent pixel electrodes 115b.

Thereafter, a plurality of pixel electrode sections are formed which include the transparent pixel electrodes 115b and the reflecting pixel electrodes 115a.

Figure 19:
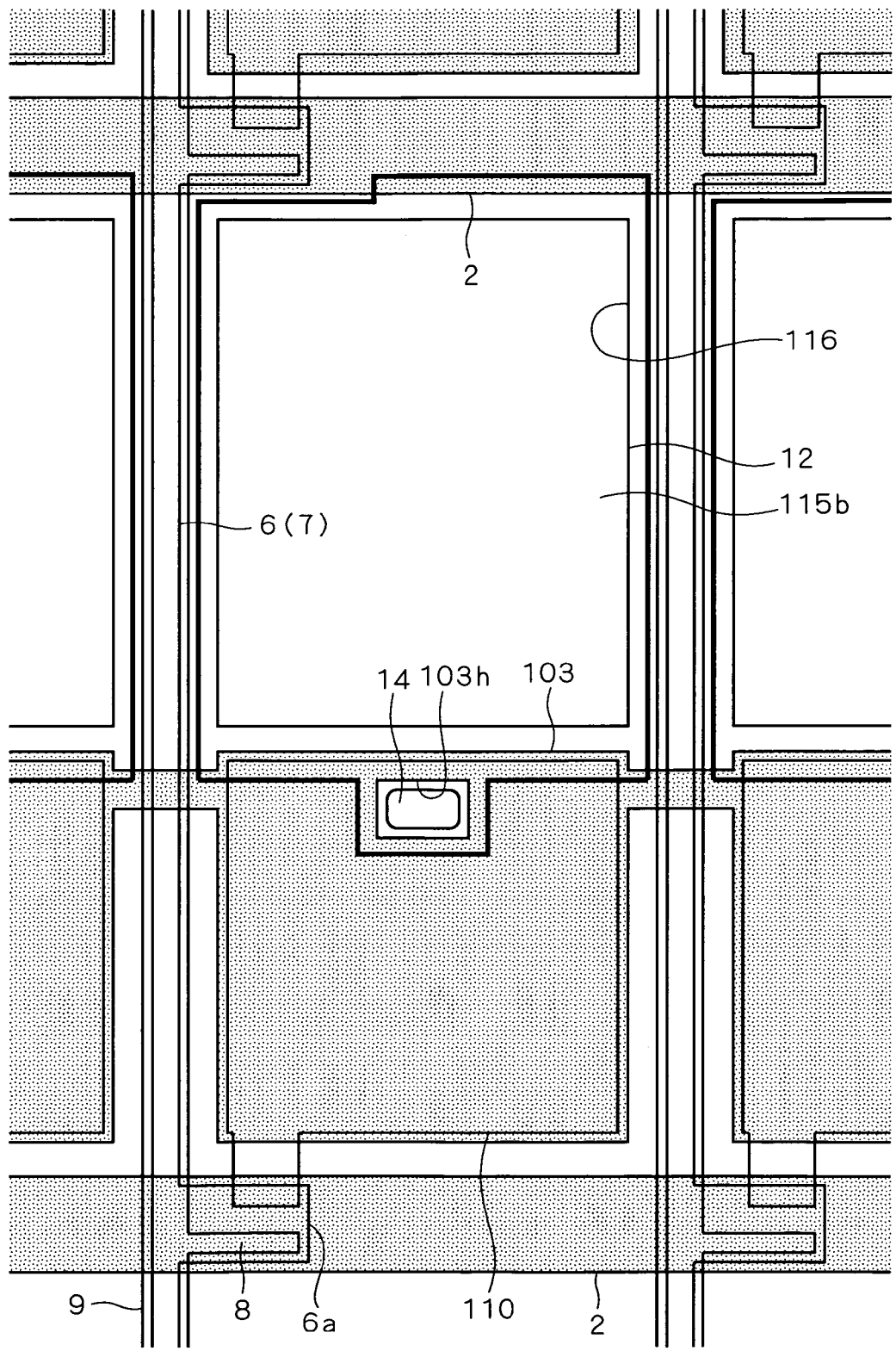

That is, as shown in FIGS. 19 and 21F, a transparent conductive film is formed on the transparent insulated substrate 1 and the second interlayer insulating film 12, and the transparent pixel electrodes 115b as first pixel electrodes are formed in areas of transparent pixels by a fifth photolithography process. Those transparent pixel electrodes 115b are formed in areas where pixel display is done by transmission out of areas (square areas in the present example) forming pixels, and extend to the insides of the contact holes 14 so as to be connected to the drain electrodes 110 through the contact holes 14.

More specifically, the transparent conductive film is obtained, for example by forming Indium-Tin oxide (ITO) containing indium oxide ($In_2O_3$) and Tin oxide ($SnO_2$) to a thickness of 100 nm using techniques such as sputtering. In the fifth photolithography process, after formation of a photoresist pattern, the transparent conductive film is etched using a known solution containing hydrochloric acid and nitric acid, and then the photoresist pattern is removed. This forms the transparent pixel electrodes 115b.

Figure 20:
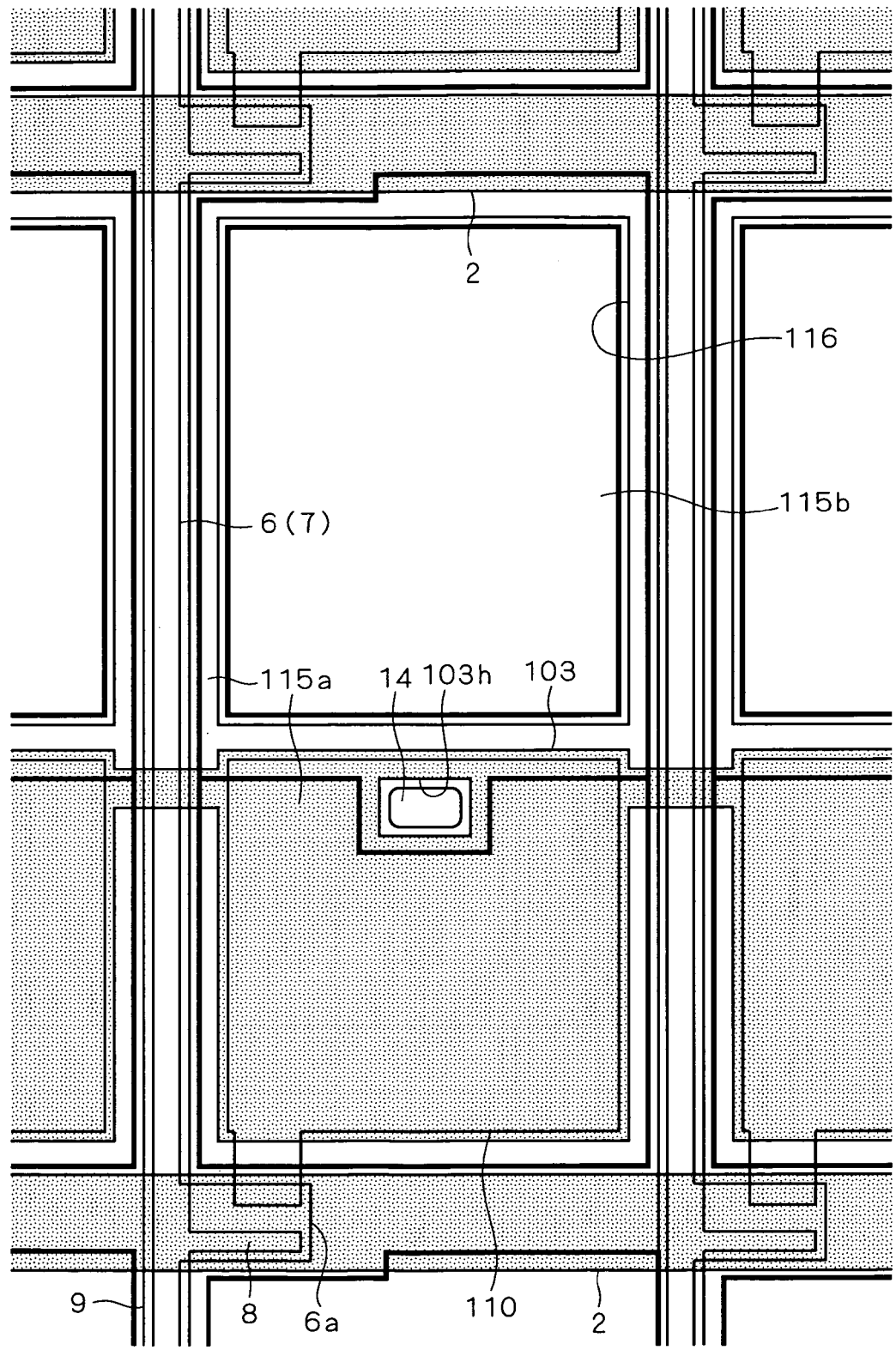

Then, as shown in FIGS. 20 and 21G, a thin metal film with high reflectance properties is formed, from which then the reflecting pixel electrodes 115a as second pixel electrodes are formed by a sixth photolithography process.

More specifically, a thin metal film with high reflectance properties has a two-layered structure which is obtained first by forming molybdenum (Mo) or an Mo alloy doped with a small amount of other elements or the like to a thickness of 100 nm using techniques such as sputtering, and then by forming thereon aluminum (Al) or an Al alloy doped with a small amount of other elements to a thickness of 300 nm as a reflection film with high reflection properties. Examples of the Mo alloy include a MoNb alloy doped with niobium (Nb) and a MoW alloy doped with tungsten (W). Examples of the Al alloy include an AlNd alloy doped with 0.5 to 3 wt % of neodymium (Nd). In this way, a two-layered thin metal film with high reflection properties, such as AlNd/MoNb or AlNd/MoW, is formed.

In the subsequent sixth photolithography process, after photoresist patterning, the above two-layered film is etched using a solution containing phosphoric acid, nitric acid, and acetic acid, and then the photoresist is removed, thereby to form the reflecting pixel electrodes 115a.

Here, the underlying MoNb or MoW alloy film as the underlying layer of the reflecting pixel electrodes 115a serves as a barrier layer in order to prevent breaks caused by differences in level on the bottom surfaces of the contact holes 14 and to prevent direct contact of the AlNd film with the ITO film forming the underlying transparent pixel electrodes 115b.

That is, if the AlNd film is formed directly on the surface of the ITO film forming the transparent pixel electrodes 115b without forming the MoNb or MoW alloy film therebetween, an AlOx (aluminum oxide) reaction layer is generated at the interface between ITO and AlNd. This causes a problem of increasing electrical resistance and thereby preventing transmission of electrical signals from the transparent pixel electrodes 115$b$ to the reflecting pixel electrodes 115$a$, resulting in display defects. Further, in the step of photoresist development during the sixth photolithography process, electrochemical reaction may be caused between ITO and AlNd in a developing solution, which may result in reducing corrosion of the transparent pixel electrodes 115$b$. Thus, the MoNb or MoW alloy film is provided between the AlNd film and the ITO film forming the transparent pixel electrodes 115$b$ to avoid direct contact therebetween. This ensures electrical connections between the transparent pixel electrodes 115$b$ and the reflecting pixel electrodes 115$a$ and prevents the occurrence of reducing corrosion of the transparent pixel electrodes 115$b$ in a developing solution.

Through the aforementioned steps, the active matrix substrate for use in semitransparent liquid crystal displays is manufactured. As opposed to this active matrix substrate, another substrate is placed which includes light-shielding plates, color filters, opposed electrodes, orientation films, and the like, and a liquid crystal layer is further provided between those substrates. This produces a semitransparent liquid crystal display that allows both transmission and reflection display.

According to the active matrix substrate with the aforementioned configuration and its manufacturing method, since the auxiliary capacitive electrodes 103 have the holes 103$h$ formed therethrough, and the contact holes 14 are formed to reach the drain electrodes 110 in areas corresponding to the areas of the holes 103$h$, even if the drain electrodes 110 have defects such as chipped parts of film or pin holes, it is possible, for the same reason as described in the first preferred embodiment, to prevent electrical short circuits between the reflecting and transparent pixel electrodes 115$a$, 115$b$ and the auxiliary capacitive electrodes 103 and thereby to prevent display defects resulting from such short circuits. Accordingly, a TFT active matrix substrate with a high yield can be produced.

Further, the use of this TFT active matrix substrate allows the production of displays with high aperture ratios and excellent display properties.

Especially, since in the second preferred embodiment, the pixel electrode sections for pixel display include the reflecting pixel electrodes 115$a$ and the transparent pixel electrodes 115$b$, the auxiliary capacitive electrodes 103 can be formed across the entire areas of the reflecting pixel electrodes 115$a$. This increases the areas of the auxiliary capacitive electrodes 103 and accordingly further increases the auxiliary capacity, thereby achieving a configuration with more excellent display properties.

MODIFICATIONS

While examples of using a Cr thin metal film as a conductive film have been shown and described herein, the present invention is not limited thereto but also allows the use of various kinds of conductive film. For example, Mo or a Mo alloy, or Al or an Al alloy may be used, in which case electrical resistances of lines and electrodes can be reduced to approximately one half to one fourth, as compared with the case of a Cr thin film.

However, in the case of using a Mo or Al alloy, if the interlayer insulating film has defects or the like, the etching of the transparent pixel electrodes 115$b$ of an ITO film with a solution containing hydrochloric acid and nitric acid may cause the solution to penetrate into the underlying layer and thereby cause excessive corrosion of the Mo or Al alloy, which may result in an increase in the percent defective rate. In such a case, the transparent pixel electrodes 115$b$ should preferably be formed of a transparent conductive film that is in an amorphous state. This is because, since the transparent conductive film in an amorphous state is chemically unstable and thus can be etched for example with weak acid such as oxalic acid (which will not corrode a Mo or Al alloy), it is possible to prevent corrosion breaks in the underlying Mo or Al alloy due to penetration of the solution.

On the other hand, if the transparent conductive film remains amorphous and if there is a subsequent step of forming the reflecting pixel electrodes 115$a$ as in the second preferred embodiment of the present invention, etching of a thin metal or laminated film of the reflecting pixel electrodes 115$a$, such as AlNd/MoNb or AlNd/MoW, may cause corrosion of the amorphous transparent conductive film of the transparent pixel electrodes 115$b$. Thus, in this case, it is desirable, after forming the transparent pixel electrodes 115$b$ in an amorphous state, to convert the electrodes into a chemically stable crystalline state.

Preferable examples of such a transparent conductive film include a ternary transparent conductive film which is converted to an amorphous state by doping ITO ($In_2O_3+SnO_2$) with zinc oxide (ZnO); and an ITO film which is converted to an amorphous state by being formed in a mixed gas obtained by mixing Ar and oxygen ($O_2$) gases, which are well known as sputtering gases, and further adding hydrogen ($H_2$) and water ($H_2O$) gases. The amorphous transparent conductive film according to the aforementioned preferred embodiments can be converted to a chemically stable crystalline state, by heating at temperatures usually approximately between 170° and 250° C. Thus, in the first preferred embodiment, heating is applied after the step of FIG. 9E. In the second preferred embodiment, heating at a temperature of approximately 200° C. is applied after the step of FIG. 21F, or an auxiliary substrate heating process or the like in forming the reflecting pixel electrodes 115$a$ by third thin metal sputtering is used. Thereby, the transparent pixel electrodes of the transparent conductive film can be converted to a chemically stable crystalline state.

While the active matrix substrates for use in transparent or semitransparent liquid crystal displays have been described in the first and second preferred embodiments, the present invention is also applicable to active matrix substrates for use in total-reflection liquid crystal displays including reflecting pixel electrodes which totally reflect light from pixels. In this case, the present invention can achieve more effective effects.

Further, the present invention is not limited to the application to active matrix substrates for use in liquid crystal displays, but is also applicable to electro-optical displays such as organic electroluminescent displays. That is, the present invention is applicable to various kinds of displays having electro-optical elements which convert electrical functions such as current supply and voltage application to optical functions such as transmittance and luminance.

While the invention has been shown and described in detail, the foregoing description is in all aspects illustrative and not restrictive. It is therefore understood that numerous modifications and variations can be devised without departing from the scope of the invention.

What is claimed is:

1. An active matrix substrate comprising:
a substrate;

gate lines and auxiliary capacitive electrodes formed on said substrate;

a first interlayer insulating film covering said gate lines and said auxiliary capacitive electrodes;

source lines formed on said first interlayer insulating film to intersect with said gate lines;

semiconductor layers constituting switching elements at intersections of said gate lines and said source lines;

drain electrodes each respectively corresponding to one of said switching elements;

a second interlayer insulating film covering said source lines, said semiconductor layers, and said drain electrodes; and pixel electrodes connected to said drain electrodes through contact holes formed in said second interlayer insulating film, wherein:

said drain electrodes are opposed in part to said auxiliary capacitive electrodes with said first interlayer insulating film sandwiched in between, so as to form holding capacitances for said pixel electrodes, and are provided so as to extend to upper areas of said auxiliary capacitive electrodes, respectively;

said contact holes are formed to reach said drain electrodes at first areas of said drain electrodes surrounded by second areas of said drain electrodes under which said auxiliary capacitive electrodes are formed, but not at the second areas of said drain electrodes under which said auxiliary capacitive electrodes are formed;

said auxiliary capacitive electrodes have holes;

at least outer edges of said holes of said auxiliary capacitive electrodes are opposed to said drain electrodes with said first interlayer insulating film sandwiched in between; and said contact holes are formed to reach said drain electrodes in areas corresponding to areas of said holes of said auxiliary capacitive electrodes.

2. The active matrix substrate according to claim 1, wherein
said first interlayer insulating film is formed of an inorganic insulating film containing silicon nitride or silicon oxide.

3. The active matrix substrate according to claim 1, wherein
said second interlayer insulating film is formed of an inorganic insulating film containing silicon nitride or silicon oxide, or of a multilayer film consisting of an underlying layer of an inorganic insulating film containing silicon nitride or silicon oxide and an insulating layer formed on said underlying layer.

4. The active matrix substrate according to claim 1, wherein said semiconductor layers constituting said switching elements comprise an ohmic contact film formed on a semiconductor film.

5. The active matrix substrate according to claim 1, wherein
said semiconductor layers constituting said switching elements extend under and along said source lines as redundant lines for said source lines.

6. The active matrix substrate according to claim 1, wherein
said pixel electrodes are connected to said drain electrodes only through said contact holes formed in said second interlayer insulating film.

7. The active matrix substrate according to claim 1, wherein:
each of said drain electrodes has a first portion extending in a first direction substantially parallel to said source lines intersecting with said gate lines, and a second portion extending in a second direction substantially perpendicular to the first direction; and said contact holes are formed in said second interlayer insulator film so as to connect said pixel electrodes to the first portions of said drain electrodes separated from the second portions of said drain electrodes under which said auxiliary capacitive electrodes are formed with said first interlayer film being sandwiched therebetween.

8. The active matrix substrate according to claim 7, wherein the first areas of said drain electrodes at which said contact holes are formed to reach said drain electrodes are located in the second portions of said drain electrodes, and the second areas of said drain electrodes surrounding the first areas and in which said contact holes are not formed to reach said drain electrodes are located in the second portions of said drain electrodes.

* * * * *